(12) United States Patent
Rhysing

(10) Patent No.: US 11,539,199 B2
(45) Date of Patent: Dec. 27, 2022

(54) SMART INTERCONNECTING CLAMP SYSTEM

(71) Applicant: UNITED AIRCRAFT TECHNOLOGIES, INC., Dover, DE (US)

(72) Inventor: Daryian Rhysing, Troy, NY (US)

(73) Assignee: UNITED AIRCRAFT TECHNOLOGIES, INC., Dover, DE (US)

( * ) Notice: Subject to any disclaimer, the term of this patent is extended or adjusted under 35 U.S.C. 154(b) by 0 days.

(21) Appl. No.: 17/284,979

(22) PCT Filed: Oct. 13, 2019

(86) PCT No.: PCT/US2019/056021
§ 371 (c)(1),
(2) Date: Apr. 13, 2021

(87) PCT Pub. No.: WO2020/077323
PCT Pub. Date: Apr. 16, 2020

(65) Prior Publication Data
US 2021/0384716 A1 Dec. 9, 2021

Related U.S. Application Data

(60) Provisional application No. 62/745,311, filed on Oct. 13, 2018.

(51) Int. Cl.
*H02G 3/32* (2006.01)
*B60R 16/02* (2006.01)
(Continued)

(52) U.S. Cl.
CPC ........... *H02G 3/32* (2013.01); *B60R 16/0215* (2013.01); *G01R 31/007* (2013.01); *G06F 3/14* (2013.01);
(Continued)

(58) Field of Classification Search
CPC ...... H02G 3/32; B60R 16/0215; B60R 16/03; G01R 31/007; G01R 31/021;
(Continued)

(56) References Cited

U.S. PATENT DOCUMENTS 3,212,193 A  10/1965  Raccio
3,627,300 A * 12/1971  Caveney ............... F16L 3/1066
                                                  269/131

(Continued)

OTHER PUBLICATIONS

Cynthia Furse, You Chung Chung, Rakesh Dangol, Marc Nielsen, Glen Mabey, and Raymond Woodward, Frequency-Domain Reflectometery for on-Board Testing of Aging Aircraft Wiring, May 2003, IEEE Transactions on Electromagnetic Compatibility, vol. 45, No. 2, pp. 306-315. (Year: 2003).*

(Continued)

*Primary Examiner* — Jeffery A Brier
(74) *Attorney, Agent, or Firm* — Brown & Michaels, PC

(57) ABSTRACT

A apparatus for monitoring the integrity of an electrical wire includes a clamp system, a sensor system, a user interface configured to receive input data and output wire information, and a control unit configured to process the wire data, process the input data, and generate the output wire information. The clamp system includes a clamp and the sensor system includes a sensor configured to retrieve the wire data. In another embodiment, a portable device is configured to obtain wire data from a smart clamping system, to transmit the wire data to a processor and to receive a multi-dimensional representation, and a computer system configured to receive the wire data generated and to generate the multi-dimensional representation of the wire. A method for monitoring a wire includes capturing wire data using a clamp, transmitting the wire data to a control unit, generating wire information to output, and outputting the wire information.

24 Claims, 16 Drawing Sheets

(51) Int. Cl.
  *G01R 31/00*  (2006.01)
  *G06F 3/14*   (2006.01)
  *G06T 19/00*  (2011.01)
  *B60R 16/03*  (2006.01)
  *G06N 20/00*  (2019.01)

(52) U.S. Cl.
  CPC ........ *G06T 19/006* (2013.01); *G06T 2200/24* (2013.01)

(58) Field of Classification Search
  CPC ....... G01R 31/022; G01R 31/024; G06F 3/14; G06T 19/006; G06T 2200/24; G06N 20/00; H01B 13/012; H01B 13/01236; H01B 13/01263; H01B 13/01281; Y10T 29/49174; Y10T 29/49194
  See application file for complete search history.

(56) References Cited

U.S. PATENT DOCUMENTS

2006/0043976 A1* 3/2006 Gervais ................. G01R 31/58
                                                      324/508
2008/0190649 A1   8/2008  Cho et al.
2015/0084989 A1   3/2015  Laughlin et al.
2015/0304487 A1  10/2015  Chaput et al.
2017/0122491 A1   5/2017  Mancuso et al.

OTHER PUBLICATIONS

Ajay Siddoju, Chaitanya Gogineni, Sandeep Bajjuri, and Shamachary Sathish, Embedded sensors to assist proper installation of wire harness clamps and to monitor degradation of wires, Mar. 2006, 9th Joint FAA/DoD/NASA Conference on Aging Aircraft, pp. 1-8. (Year: 2006).*

Kenneth Blemel and Cynthia Fuse, Applications of Microsystems and Signal Processing for Wiring Integrity Monitoring, Mar. 2001, In 2001 IEEE Aerospace Conference Proceedings (Cat. No. 01TH8542), vol. 7, pp. 7-3247 to 7-3253. (Year: 2001).*

International Search Report for PCT/US2019/056021 dated Feb. 6, 2020.

* cited by examiner

SMART INTERCONNECTING CLAMP SYSTEM

REFERENCE TO RELATED APPLICATIONS

This application claims one or more inventions which were disclosed in Provisional Application No. 62/745,311 entitled "Augmented Reality Monitoring System (ARMS) for Smart Inter-Connecting Clamp (ICC)". The benefit under 35 USC § 119(e) of the United States provisional application is hereby claimed, and the aforementioned application is hereby incorporated herein by reference.

BACKGROUND OF THE INVENTION

Field of the Invention

The invention pertains to interconnecting clamp systems, and more particularly, to smart interconnecting clamp systems to clamp wire bundles and to monitor and determine wiring integrity.

Description of Related Art

An electrical wire harness is an assembly of wires, or cables, that transmit signals (e.g., electrical signals to deliver power or transmit data). These wires are arranged in a particular order and bound together to facilitate installation, repair, and maintenance of the wires and the connection of different pieces of equipment distant from each other. A wire harness may be used in aircraft, automobiles, ships, heavy machinery, or other vehicles or equipment. Wires that run throughout vehicles, such as aircraft and engine compartments, need to be secured into bundles and to the airframe with electrical clamps (i.e. Adel clamps) to prevent interfering with moving parts or chafing. For example, the MS21919 aircraft clamp is used by many aircraft and vehicle OEMs.

Vehicle inspections are performed frequently in attempts to ensure that vehicles are available for deployment when needed. Wiring bundles require visual inspections to detect, for example, chafing of electrical wiring or contact with fuel lines, hydraulic lines, and oxygen lines. Visual inspections need to include the inspection of the wiring harness under these electrical clamps. The cushions that surround the electrical clamps are exposed to heat, vibration, and a variety of fuel and other chemical fluids. Inspections have found instances when the cushion's wrapping edge has been in good condition, but the cushion has worn away on the inside of the band to expose a metal band of the clamp that chafes, abrades, or cuts through the wire insulation. Additionally, it has been noted that on fuel systems, torn cushions exposing the metal bands of the clamps cause unwanted fuel migrations, or low fuel pressure. In hydraulic lines, electrical wiring clamp bands (MS21919) have been found rubbing through hydraulic system lines, resulting in a loss of hydraulic level. Intermittent electrical faults have lead technicians to find an Adel clamp cutting into an electrical harness.

Unfortunately, visual inspection of these clamps is inefficient because mechanics need to remove all the clamps that are installed on an aircraft or vehicle. A rotary craft may have up to 2,000 of these clamps and a commercial aircraft may have up to 15,000 of these clamps. Removing this many clamps and then inspecting the clamps and the corresponding bundles of wires for damage consumes a lot of time.

Currently, vehicle maintenance schedules for each vehicle are maintained in a central database, and the database notifies personnel to perform the scheduled maintenance function when due based on calendar driven preventive maintenance schedules. Repair diagnostic tests are performed when maintenance personnel are made aware of a need for repair. Known maintenance schedule notification and repair processes are inefficient because the maintenance personnel are not always informed of maintenance needs, and vehicle diagnostic tests can be time-consuming and costly. Additionally, the potential delay in notifying maintenance personnel of a need to repair or perform maintenance procedures often renders a vehicle out of service or risks the safety of the vehicle and operator.

Maintenance of wire harnesses may be performed manually. Instructions for troubleshooting a wire harness may include information regarding electrical connectors (e.g., sockets and plugs) where wires are terminated, terminal blocks, circuit breakers, or fasteners. Currently, instructions for troubleshooting a wire harness may be in the form of paper technical manuals, electronic files, and portable devices such as hand-held tablets containing electrical diagrams. The technical manuals must be printed or the documentation must be retrieved from the hand-held device manually. Often, the printing or tablet is then sorted or provided to technicians. Technicians must often flip through the reference to locate the right instructions. Referencing instructions may split the attention of the technician. Referencing instructions may also require more time than desired. Further, the instructions may be confusing or difficult to read. Still further, referencing instructions may require the technician to keep an updated version.

The electrical wiring harnesses used particularly in the aeronautic industry are quite complex by the number of wires and connectors included. Troubleshooting these electrical wiring harnesses is traditionally done on board the aircraft using the manufacturing drawings and specifications on paper or handheld electronic devices, which are used for performing checks on the wiring routing and connection operations and which can have labels facilitating the identification of the wires. A significant difficulty with this troubleshooting process is the handling of the manufacturing documentation because of its complexity and a high possibility of making mistakes.

Several proposals to improve the process by eliminating the use of paper or electronic documentation and shift to augmented reality have been made in the prior art. U.S. Pat. No. 6,272,387 describes a computerized information system for managing the documentation for manufacturing electrical wiring harnesses that allows displaying on a screen the routing and connection information of the wires making up an electrical wiring harness. U.S. Pat. No. 6,625,299 describes a system that uses augmented reality technology to display the wiring harness manufacturing documentation, using particularly HMD ("Head-Mounted Display") devices. U.S. Pat. No. 8,902,254 describes an augmented reality portable device for assisting the technician through information displayed on a screen. U.S. Pat. No. 7,093,351 B2 and U.S. Pat. No. 7,647,695 B2 describe, respectively, a device and a method for assisting the technician on specific operations for guiding the connection of the wires of a connector. Although all these proposals represent an advance over the traditional method of visualizing electrical wiring harnesses, there is a need in the industry to improve the troubleshooting of electrical wiring harnesses and isolating individual faulty wires, particularly in industries such as aeronautics, which are significantly increasing the use of electrical devices.

Traditional methods of evaluating damage and developing potential repair scenarios in a production environment are currently based on two dimensional documentation and generalized procedures dictated by the drawing based environment being used in the design process. This method requires a user to have the two dimensional documents on hand, along with supplemental reference information, in order to be able to correctly identify the location at which a repair must be made, as well as to ascertain what the maintenance and repair history is relative to the operations that need to take place.

Specific physical damage tends to be more difficult to find and repair on a single wire within a wiring bundle, and this damage tends to be more critical to repair due to the complexity of the electrical systems. Skilled technicians understand that the replacement of these clamps is not trivial. On Dec. 29, 2000, for example, a Delta Airlines aircraft flight 219 (L1011) had an electrical fire due to electrical arcing of the windshield heat wire bundle. The cause of the electrical arcing was an Adel clamp damaging wires in and a 30-wire bundle. Twenty of the 30 wires were observed burned. The repair costs of the many systems these clamps support can be enormous.

Accordingly, a need exists for improved clamps, clamp systems, and methods and systems to detect damage in wires and wire bundles secured with the clamps and clamp systems.

SUMMARY OF THE INVENTION

A clamping system including a real-time vehicle tracking and monitoring system with augmented reality visualization and fault localization is disclosed that addresses one or more of the issues discussed above.

In an embodiment, an apparatus for monitoring the integrity of an electrical wire or a wiring harness includes: a clamp system including at least one clamp to clamp the wire or the wiring harness; a sensor system including at least one sensor supported by the smart clamp, the at least one sensor configured to retrieve wire or wiring harness data; a user interface configured to receive input data and output wire or wiring harness information; and a control unit configured to process the wire or wiring harness data, process the input data, and generate the output wire or wiring harness information.

In another embodiment, an apparatus for providing an augmented reality view of a vehicle includes: a portable device configured to obtain wire or wire harness data from a smart clamping system, to transmit the wire or wire harness data to a processor, and to receive a multi-dimensional representation; and a computer system remote from the portable device configured to receive the wire or wire harness data generated by the portable device, generate a number of digital definitions in a metrology process using the wire harness data, generate a multi-dimensional representation of a combined augmented reality of the wire or wiring harness, and transmit the multi-dimensional representation to the portable device for display, wherein the portable device includes at least one user interface, and wherein the multi-dimensional representation is configured to be viewed by a user using the user interface.

In another embodiment, a method for monitoring a wire or wire harness includes: capturing wire or wire harness data using a clamp, the clamp including a sensor; transmitting the wire or wire harness data captured by the clamp to a control unit; generating wire or wiring harness information to output; and outputting the wire or wiring harness information through a portable device.

In another embodiment, a smart interconnecting clamp comprising: a first body portion; and a second body portion configured to mate with the first body portion to form a center hole for holding a wire or wire bundle, the mated first body portion and second body portion having a first side, a second side directly adjacent the first side, a third side directly adjacent the second side and opposite the first side with respect to the center hole, and a fourth side directly adjacent the third side and the first side and opposite the second side with respect to the hole, the first side including a ridge with a center gap.

In another embodiment, a bracket for connecting a smart interconnecting clamp to a surface includes a body having a dovetail-shaped groove, the groove including a tab; a flange connected to the body, the flange having a hole configured for insertion of a fastener.

In another embodiment, a bracket for connecting a smart interconnecting clamp to a surface includes an elongated body, the elongated body having a length and a dovetail-shaped groove extending the length, the dovetail-shaped groove having a center hole configured for insertion of a rivet.

DETAILED DESCRIPTION OF THE INVENTION

Figure 1:
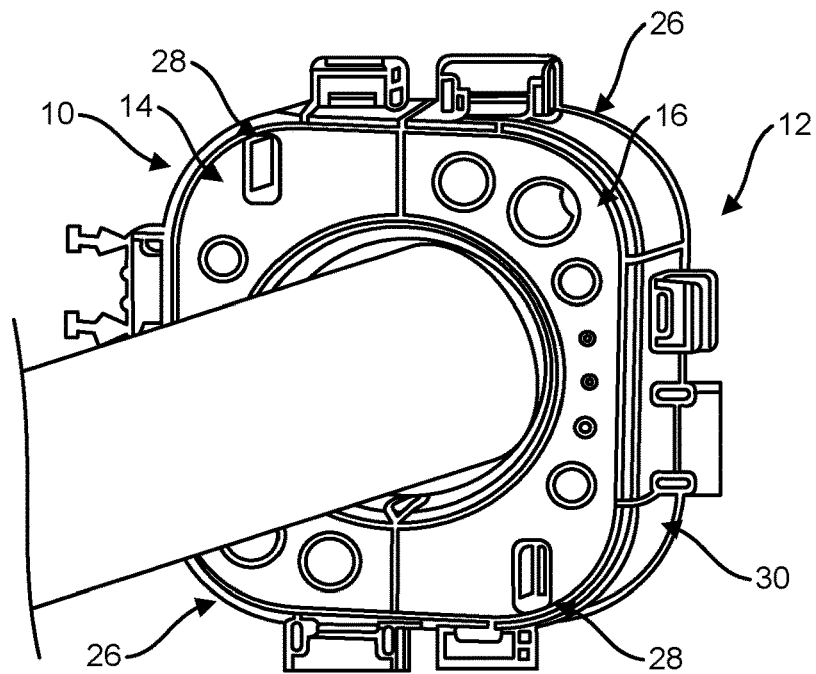
FIG. 1 illustrates a perspective view of a smart clamp 10 clamping a wire bundle, according to an embodiment.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

The terminology used herein is for the purpose of describing particular example embodiments only and is not intended to be limiting. As used herein, the singular forms "a", "an", and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As discussed above, a clamping system including a real-time vehicle tracking and monitoring system with augmented reality visualization and fault localization is disclosed.

Embodiments of a smart clamp disclosed herein enable testing of the wiring integrity in tight spaces where other hand tools cannot reach. Because there is minimal manual or physical force required, the smart clamp design reduces the risk of Repetitive Strain Injuries (RSI) that can occur with monotonous hand crimping. The smart clamp offers a reliable method for detecting wiring defects before they become faults. Given that the smart clamp secures wire bundles, the smart clamps can serve as a useful automated device for ensuring the integrity of electrical systems. The functions of the smart clamp can include:

detecting aging effects on wiring through an interconnection system provided by the smart clamp;

providing data regarding failure characterization and diagnostics;

identifying wiring system failure mechanisms and degradation processes;

checking robust insulators and conductors for contamination, degradation over time, metal shavings from repairs, exposure to fluids, Ph levels and physical properties of the insulation such as washing solutions or hydraulic fluids;

detecting physical abuse such as stepping on the wire bundle;

detecting changes in the physical and chemical properties of insulation such as flexibility, hardness, tensile strength, compressive strength, and torsion strength; and detecting environmental effects that include temperature, humidity, and solar exposure.

The smart clamp is a non-destructive interconnecting device for wiring systems that could become an integral part of an aircraft to continuously monitor and locate wiring faults and wiring defects. The smart clamp is light and nonmetal in situ inspection technology for aircraft wire integrity. The smart clamp includes uniquely identifiable electronic modules that monitor signals within aircraft wiring without need for disconnection. The smart clamp monitors the wiring signal information and stores corresponding data in a database. The use of the smart clamp enables real-time inspection of wiring integrity. The data can determine schedule maintenance and statistical analysis of aircraft wiring by the use of a microelectronic module with integral software to process data generated by built-in sensors housed within the smart clamp, a grip, or an external electronic compartment unit surrounding a wire bundle. The smart clamp may contain many sensor functionalities, such as a programmable solid state sensor with an arc detection and wire damage detection/locator module.

Figure 2:
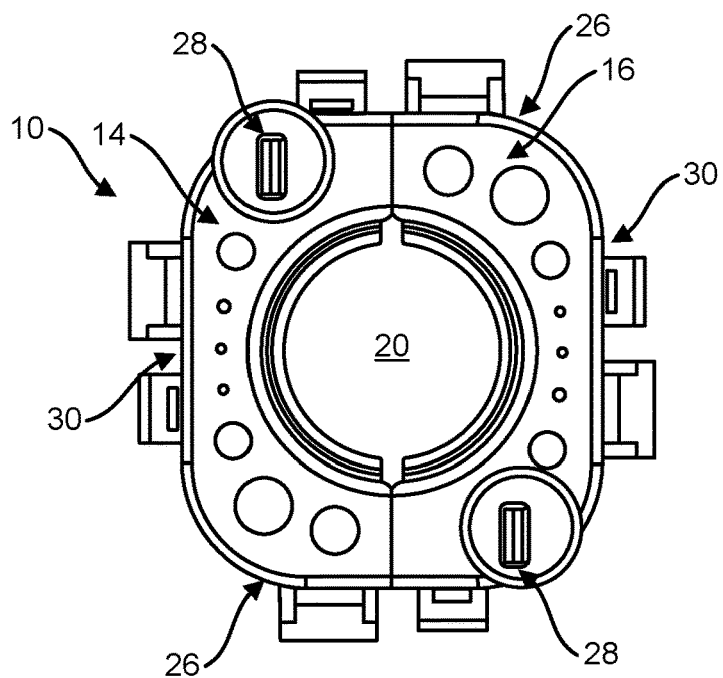
FIG. 2 illustrates a front view of the smart clamp of FIG. 1, without a wire bundle.
Figure 3:
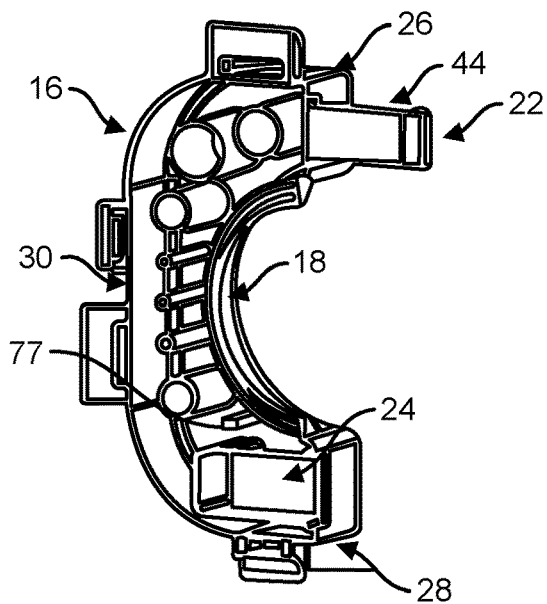
FIG. 3 illustrates a body portion of a smart clamp, according to the embodiment of FIG. 1.

FIG. 1 illustrates a perspective view of a smart clamp 10 clamping a wire bundle 12. FIG. 2 illustrates a front view of the smart clamp 10 without a wire bundle. According to FIG. 1 and FIG. 2, the smart clamp 10 includes a first body portion 14 and a second body portion 16 that can be separated or fastened together. The first body portion 14 can be identical with the second body portion 16, for example, to increase manufacturing efficiency, decrease manufacturing cost, and increase interconnectivity and simplicity of the clamping system. FIG. 3 illustrates either the second body portion 16 of the smart clamp 10 or the first body portion 14 of the smart clamp 10. Each of the first body portion 14 and the second body portion 16 include a semicircular, radially inward-facing surface 18. Fastening the first body portion 14 to the second body portion 16, the radially inward-facing surfaces for a full circle defining a channel 20 through the smart clamp 10 and through which the wire bundle 12 extends. The continuously curved characteristic of the circular, radially inwardly facing surfaces 18 formed during fastening of the first body portion 14 with the second body portion 16 lessens the risk of abrasion or cutting into a clamped wire or wire bundle. The circular shape also increases the area and uniformity of clamping. Other non-sharp shapes, such as an oval, are conceived, as well.

The first body portion 14 and the second body portion 16, for example, can be made of plastic, carbon fiber, or carbon nanotubes, though other sufficiently rigid materials can be suitable. Using plastics or carbon in the smart clamp 10 is advantageous over metallic securing devices because plastics and carbon are lighter, easier to install, and easier to bend. Plastic and carbon clamps also can achieve securing strength as strong as metal clamps.

Figure 4:
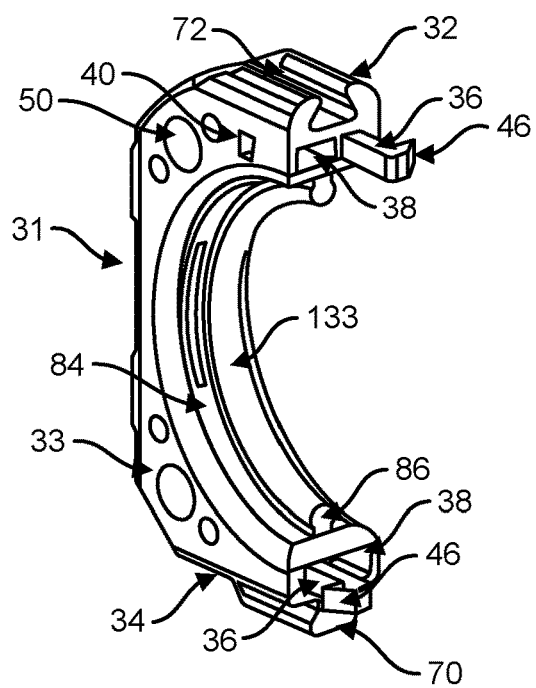
FIG. 4 illustrates a body portion of a smart clamp, according to an embodiment.

The first body portion 14 and the second body portion 16 fasten by connection of complementary snap-fit tab assemblies, which include a tab 22 and a complementary tab receptacle 24. The body portions 14, 16 can each have a first end portion 26, a second end portion 28, and a third end portion 30. The first end portion 26 can include the tab 22, the second end portion 28, which is opposite the first end portion 26, can include the tab receptacle 24. The third end portion 30 connects the first end portion 26 and the second end portion 28. The tab 22 at the first end portion 26 of the first body portion 14 is releasably attached to the receptacle 24 at the third end portion 28 of the second body portion 16, and the tab 22 at the first end portion 26 of the second body portion 16 is releasably attached to the receptacle 24 at the third end portion 28 of the first body portion 14. FIG. 4 illustrates half of a smart clamp 31 including a body portion 33 and an alternative embodiment of a complementary snap-fit tab assembly, wherein each first end portion 32 and each third end portion 34 includes a tab 36 and a tab receptacle 38.

Referring to FIG. 1, FIG. 3, and FIG. 4, to lock the tab 22, 36 in the receptacle 24, 38, a locking channel 40 can be drilled or otherwise formed from a front face 42 of the body portion 14, 16 into the receptacle 24, 38. When the tab 22, 36 is being inserted into the receptacle 24, 38, a projecting end 44, 46 of the tab 22, 36, which may have a wedge-like shape, presses against an interior wall of the receptacle 24, 38, which elastically deflects the tab 22, 36. When the tab 22, 36 is fully inserted into the receptacle 24, 38, the projecting end 44, 46 of the tab 22, 36 snaps out into the locking channel 40, retaining the two body portions in a clamped position.

The locking channel 40 can serve also to release the tab 22, 36. A tool can be inserted into release channel 40, 42 to depress or bend the tab 22, 36, freeing the projecting end 44, 46 and allowing the tabs 22, 36 to be pulled out of the receptacles 24, 38, thereby allowing the connected body portions (e.g., first body portion 14 and second body portion 16) to be pulled apart, or unclamped.

Other now-known or future-developed releasable fastening mechanisms can be used alternatively.

Figure 5:
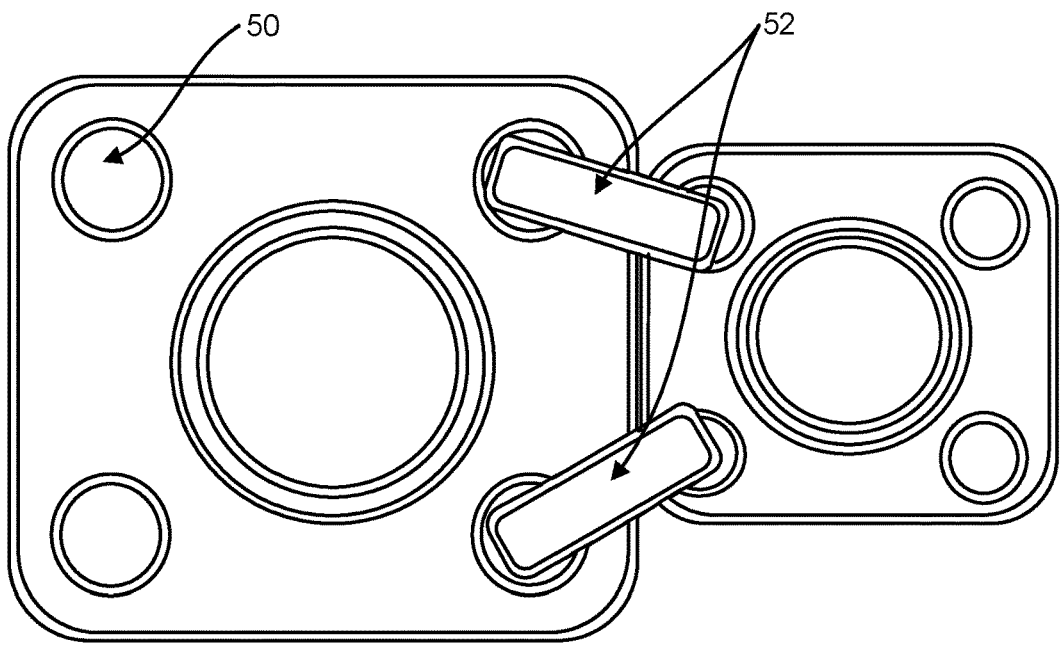
FIG. 5 illustrates two smart clamps connected with wire ties, according to an embodiment.

Additional holes 50 through the first body 14 and the second body 16 are configured to accommodate a strap tie 52 or other fastener, as illustrated in FIG. 5. A stack of clamps 10 can be tied together using the additional holes 50, for example.

Figure 6:
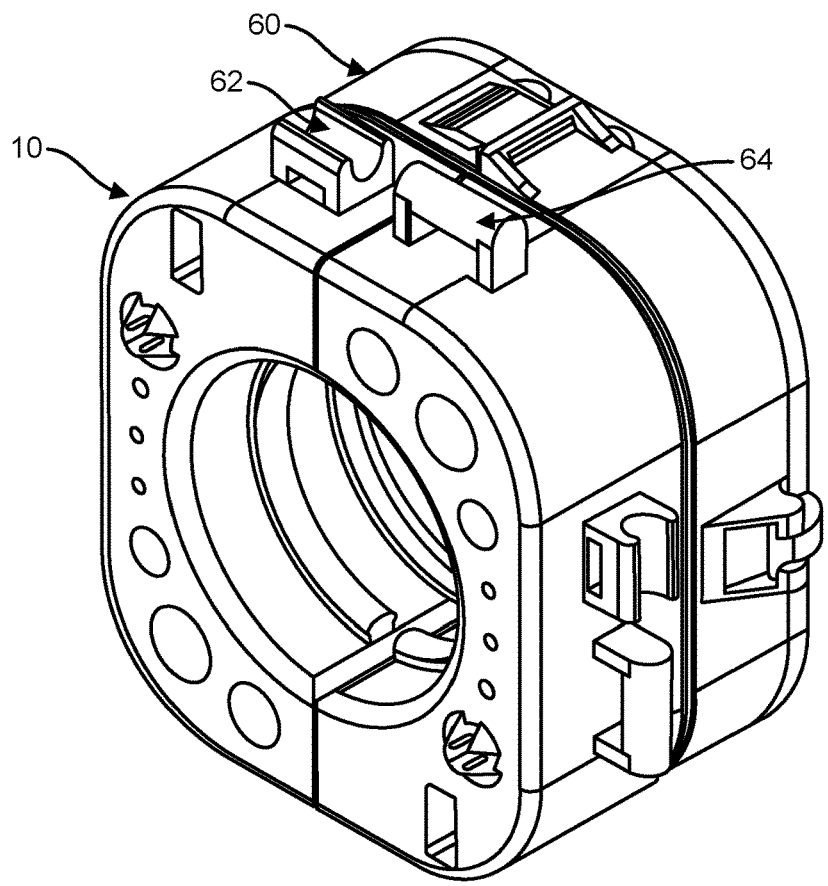
FIG. 6 illustrates the smart clamp of FIG. 1 connected to sensor housing, according to an embodiment.

Referring to FIGS. 1-3, and additionally to FIG. 6, which illustrates the smart clamp 10 connected to sensor housing 60, the smart clamp 10 can include a first interconnection element 62 and a second interconnection element 64 to connect two smart clamps. The first interconnection element 62 is configured, and also located with respect to the second interconnection element 64, to mate with the second interconnection element 64 of another smart clamp 10. In the depicted embodiment, the first interconnection element 62 is a rod, and the second interconnection element 64 is shaped like a concave half-pipe, with a rotation angle of more than 180 degrees, such that the second interconnection element 64 can snap around the first interconnection element 62 and retain the first interconnection element 62. The rod or cylindrical shape of the interconnection allows two smart clamps 10 to be connected at variable angles with respect to each other. A friction fit can facilitate the snap fit, and can also help hold the desired angle after positioning two interconnected smart clamps 10.

Each side of the smart clamp 10 can include a pair of interconnection elements 62, 64. Accordingly, the first end portion 26 can include the first interconnection element 62, the second end portion 28 can include the second interconnection element 64, and the third end portion 30 can include both a first interconnection element 62 and a second interconnection element 64. The smart clamps 10 can be interconnected in each side, and connected into an array.

Referring to FIG. 4, and also to FIGS. 7-10, the smart clamp 31 may also have a ridge 70 on one side and a groove 72 on the opposite side. The groove 72 is configured to slide into the ridge 70, such that sliding the ridge 70 of one smart clamp 31 into the groove 72 of another smart clamp 31 interlocks the two smart clamps 31. The ridge 70 can provide an additional locking support element 71 at a point of stress for the curved body. The ridge 70 has a first width at a first diameter and a narrower width than the first width at a second diameter radially inward from the first diameter. The groove 72 has a matching shape, such that the wider width of the second ridge 70 is held radially by the narrower width of the groove 72.

Figure 7:
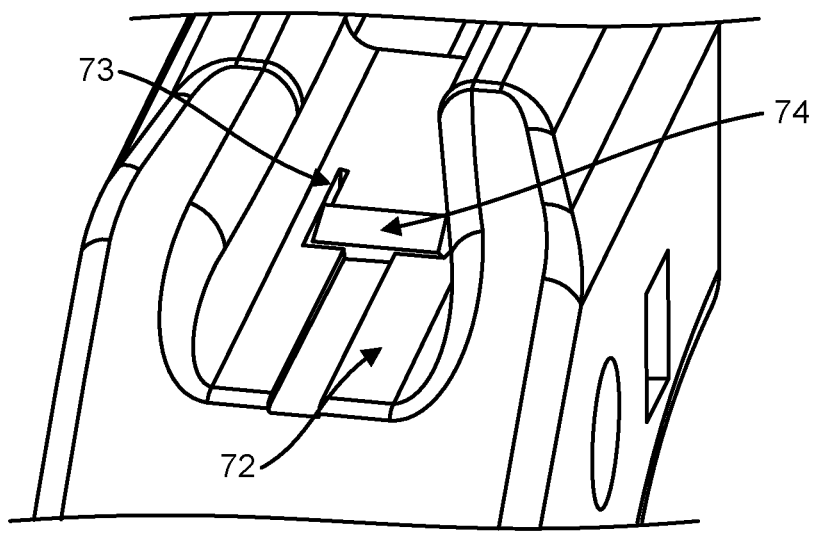
FIG. 7 illustrates a partial perspective view of a smart clamp, according to an embodiment.
Figure 8:
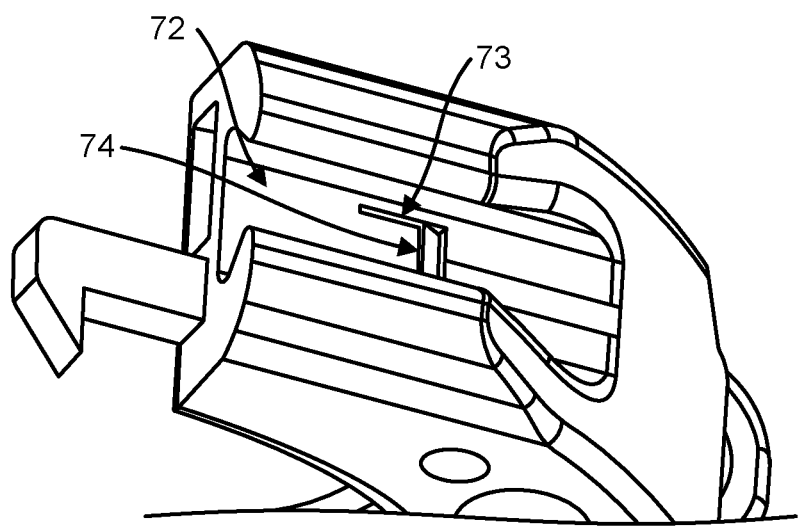
FIG. 8 illustrates a partial perspective view of the smart clamp of FIG. 7.
Figure 10:
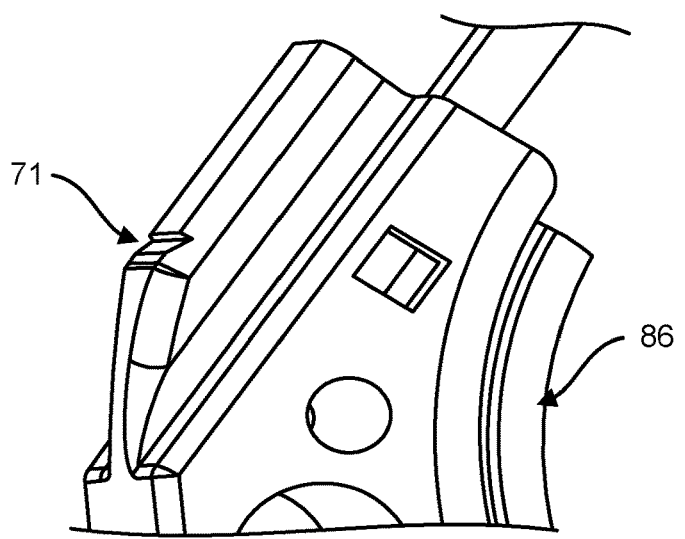
FIG. 10 illustrates a partial perspective view of the smart clamp of FIG. 7

Referring to FIGS. 7, 8, and 10, at the groove 72, a notch 73 with a snap-fit tab or lip 74 is configured to be complementary in shape to the locking support element 71 to have a ramp and a flat section. Accordingly, the ramp is angled downward toward the front of the mating body portion to form a receiving space. The locking support element 71 can slide along the ramp as two body portions of two smart clamps 31 are interconnected. The notch 73 can be at a distal end of the ramp. When the two body portions of the two clamps 31 are brought together, the lip 74 slides into the notch 73, such that, when the two body portions of the two smart clamps 31 are fully engaged, the locking support element 71 and the notch 73 and lip 74 are in an interlocked configuration, flush against one another.

Figure 11:
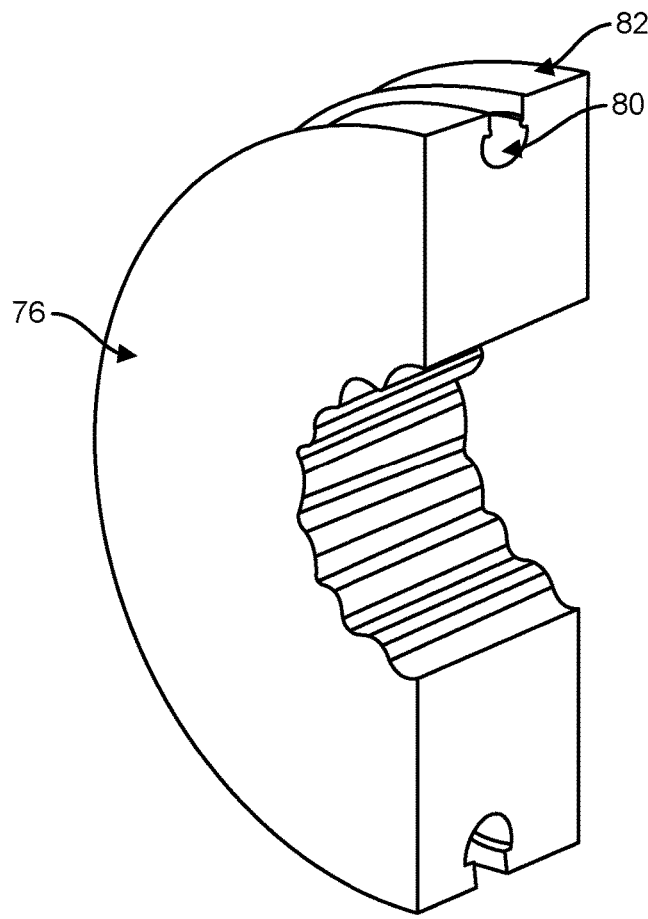
FIG. 11 illustrates a perspective view of a grip segment.

The smart clamps can also include a grip that can be replaced with a variety of grips having differently sized inner diameters to hold or clamp variously sized wires or wire bundles. FIG. 11 illustrates a grip 76. The grip 76 has a groove 80 in a radially outwardly facing surface 82.

Figure 9:
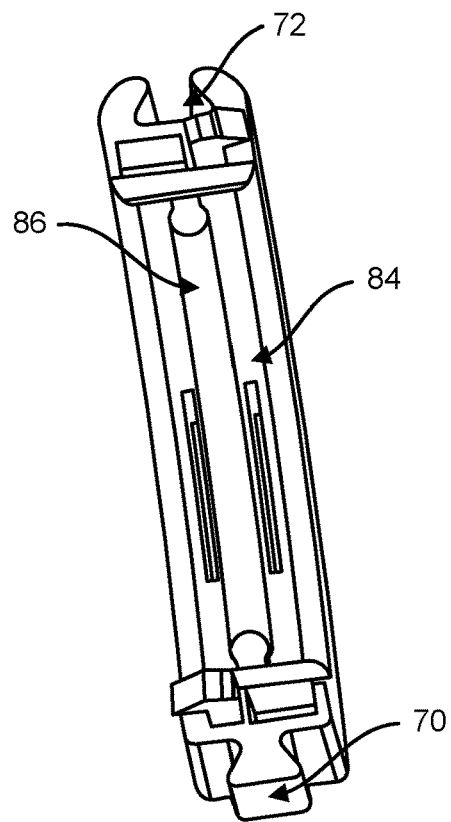
FIG. 9 illustrates a partial perspective view of the smart clamp of FIG. 7.

As seen in FIGS. 4, 9, and 10, a radially inwardly facing surface 84 includes a second ridge 86. This second ridge 86 is configured to fit into the groove 80 of the grip 76. The second ridge 86 can be molded or otherwise fashioned in a substantially semi-circular shape suitable to slidably insert into the groove 80. The second ridge 86 has a first width at a first diameter and a narrower width than the first width at a second diameter radially inward from the first diameter. The groove 80 has a matching shape, such that the wider width of the second ridge 86 is held radially by the narrower width of the groove 80.

The grip 76 may be molded or otherwise formed from any plastic or rubber known in the art as long as the material is flexible enough to allow the grip 76 to flex and to permit support to the wire bundles there between, and also for the complementary snap-fit tabs 36 and tab receptacles 38 to fully mate and interlock without deforming permanently. Exemplary types of plastic used may be polyethylene, polypropylene, polyvinyl, malemide, polyamide, polyaryletherketone and various plasticized combinations of such materials. Grip material should be soft enough so the material does not chafe into the wires that are being held in place, and hard enough so it can remain abrasion resistant. Grip material should be able to reduce noise due to surface contact and provide a strong grip. Grip material should meet the FAA regulations for flame, smoke, and toxicity and should remain an integral part of the smart clamp through required manufacturing, bonding or assembly processes. The grip material may be similar to the material of the smart clamp 10, 31, or could be different to meet requirements of end use application and cost implications.

In some embodiments, the grip 76 is mostly comprised of thermoplastics and thermoset materials.

Thermoplastics:

Silicone or blends: High temperature and chemical resistant, transparent, liquid injection overmolding on clamp or cut-to-size strip and bond to clamp body;

Fluoroelastomers or blends: High temperature and chemical resistant, cut-to-size strip and bond to clamp body; and Siltem or blends of material with siloxane in backbone of polymer chain: High temperature and chemical resistant, softness to reduce noise due to other surfaces, process through injection molding or extrusion;

Thermoset:

Polyamide Imide: Higher curing for clamp body, local curing can be modified to achieve softness in grip and hardness in clamp; and Epoxy or Polyamide with elastomer particles: Epoxy and dissolvable elastomer mixture is poured into a mold to form the clamp, the elastomer particles phase separate as the epoxy is being cured, the phase separation is designed such that the elastomer material migrated towards a desired location for the grip;

Other Materials:

PolyMethyl Methacrylate (PMMA) as a base material. Fluorosilicone specifically Silastic FL 70-9201 made by Dow Corning was chosen for its weight, hardness, overmoldability, colorablity, and prior FAA approval.

In some embodiments, the smart clamp is mostly comprised of thermoplastics and thermoset materials.

Thermoplastics:

Polyetherimide (Ultem) or blends: FAA approved, high temperature and chemical resistant; and Polycarbonate (Lexan FST) or blends: FAA approved, transparent Thermoset:

Polyamide Imide: Higher curing for clamp body;

Epoxy or Polyamide with elastomer particles: Epoxy and dissolvable elastomer mixture is poured into a mold to form the clamp, the elastomer particles phase separate as the epoxy is being cured. The phase separation is designed such that the elastomer material migrated towards a desired location for grip.

One or more sensors 77 can be disposed inside or on the smart clamp body portions 14, 16, 33 (see FIG. 3, for example), or inside or on the grip 76, and each smart clamp 10, 31 can be color coded depending on the specific type of sensor and what the sensor detects. Any now-known or future-developed sensor can be used.

In an embodiment, the sensor may include electrical leads (not shown) that extend within the body portions 14, 16, 33 or the grip 76 to terminal access points. The electrical leads may be connected to a wireless device (not shown) that can send a signal to a control module (not shown). The control module, in response, can adjust operating parameters. The control module (not shown) can also include a display gauge for displaying a numerical magnitude of a parameter reported by the sensor, such as temperature. For example, if the sensor is a thermistor, then the gauge may be a temperature gauge displaying a temperature reading transmitted by the thermistor over the wireless device.

Figure 12:
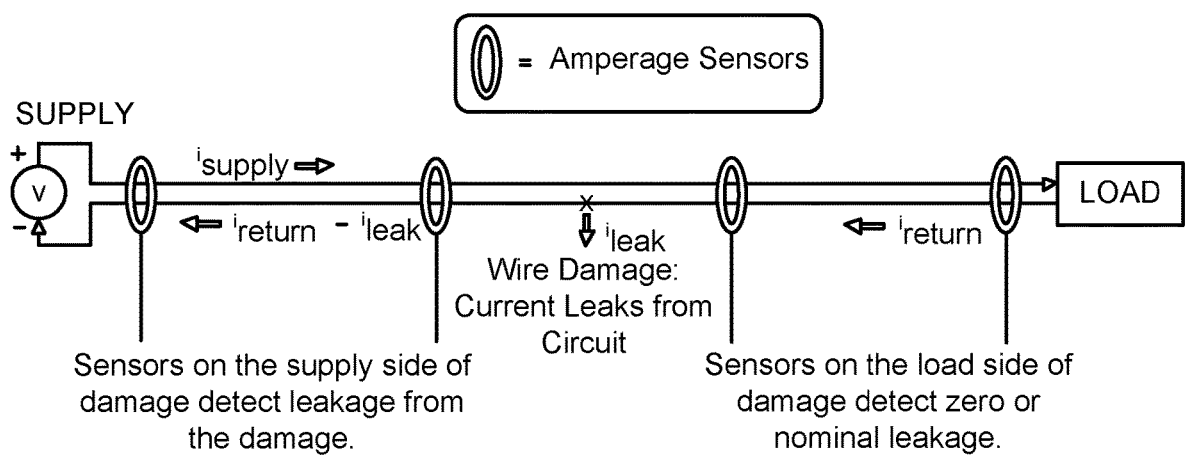
FIG. 12 is a layout illustrating how leakage current can be used to detect and locate problems in an aircraft circuit by the use of multiple smart clamps with amperage sensors, according to an embodiment.
Figure 13:
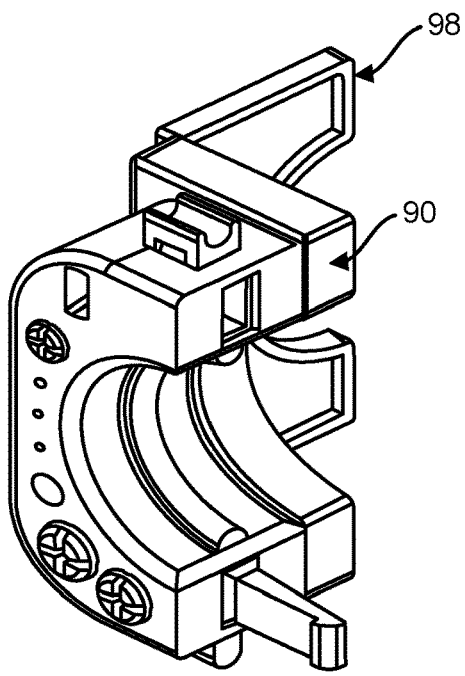
FIG. 13 illustrates a perspective view of an electronic housing module connected to a smart clamp, according to an embodiment.
Figure 14:
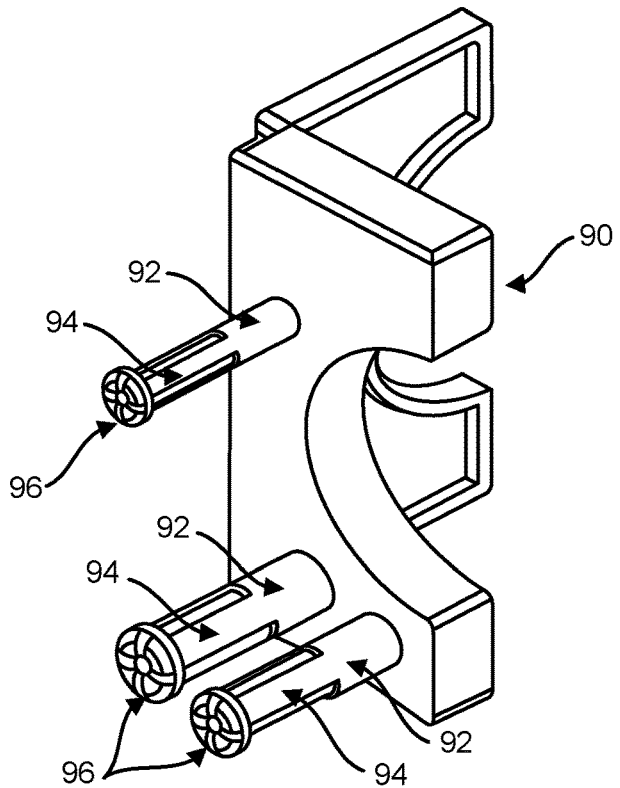
FIG. 14 illustrates a perspective view of a segment of the electronic housing module of FIG. 13.
Figure 15:
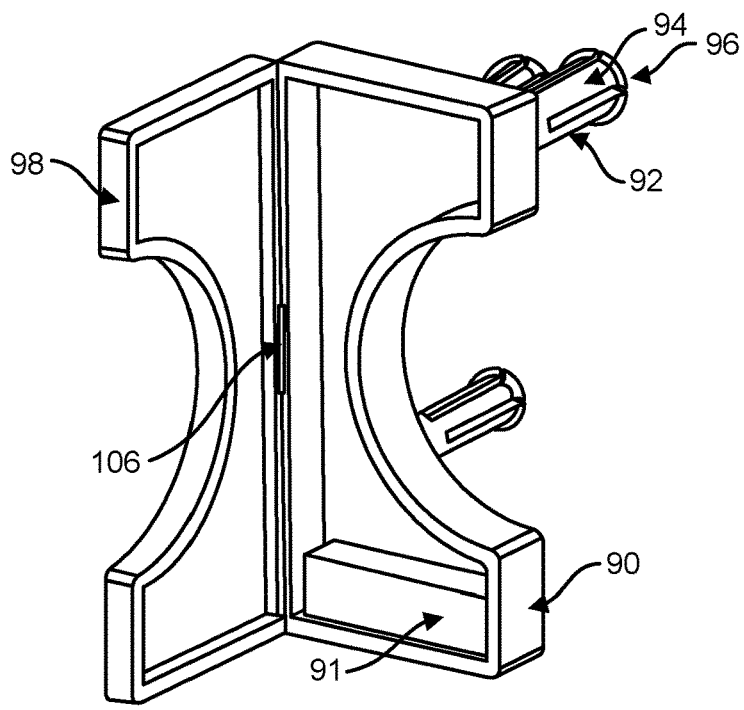
FIG. 15 illustrates a perspective view of the segment of the electronic housing module of FIG. 13.
Figure 16:
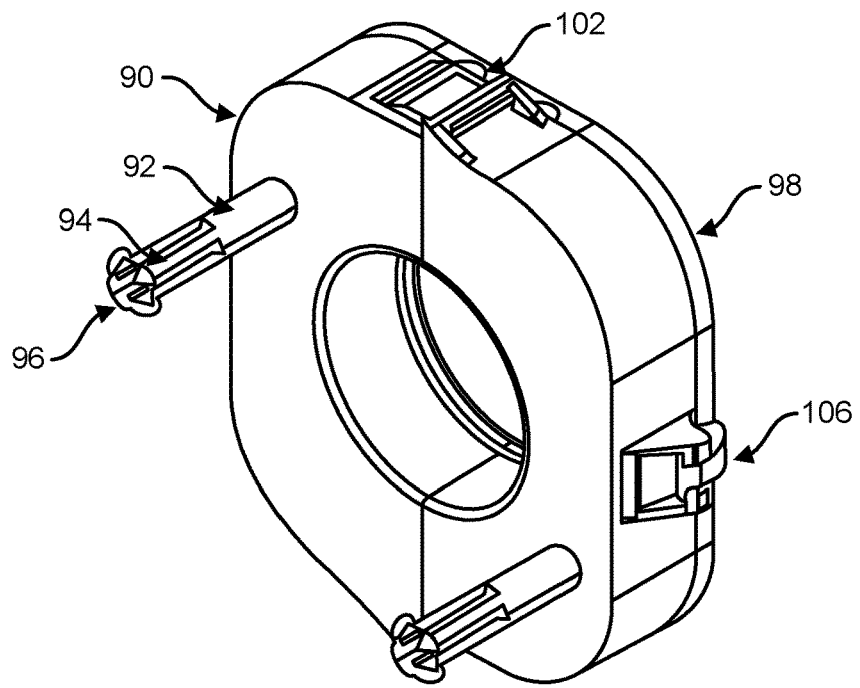
FIG. 16 illustrates a perspective view of the electronic housing module of FIG. 13.
Figure 17:
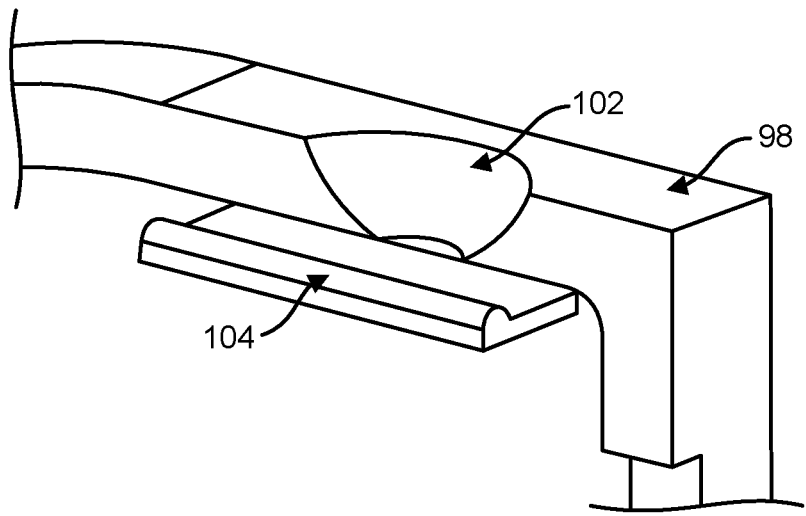
FIG. 17 illustrates a partial, perspective view of a lid of the segment of the electronic housing module of FIG. 13.

There are industry standards for acceptable leakage current, which ranges from 0.25 mA to 3.5 mA depending upon whether the device is handheld and/or grounded. FIG. 12 shows a layout of how leakage current can be used to detect and locate problems in an aircraft circuit by the use of multiple smart clamps with amperage sensors. Having an amperage sensor that can detect less than 0.1 mA would give a low enough range to detect problems in circuits without much leakage current. The idea being, any change in leakage current from a calibrated nominal level could be indicative of wire damage/wear or another problem with the devices on the circuit. It is also important to consider the timing of the sampling and the size of the sensor.

FIGS. 6 and 13-17 illustrate an electronic housing module 90, which can house electronic components 91, such as sensors, a radio receiver or transmitter, a circuit board or logic board, associated circuitry, etc. The electronic housing module 90 includes snap tubes 92 to connect to the smart clamp 10. The snap tubes 92 include fingers 94 and retaining tabs 96, such that the fingers 94 can be bent inward when pushed through the additional holes 50 from a first side of the smart clamp 10, until the retaining tabs 96 emerge on an opposite side of the smart clamp 10 and the retaining tabs 96 snap outward to lock the electronics housing module 90 to the smart clamp 10.

Access to the electronics is accomplished by use of a lid 98 with a fingertip recess 102 and a retention lip 104. The retention lip 104 can snap into a groove or ledge (not shown) inside the electronics housing module 90. A user can open the lid 98 by pulling on the fingertip recess 102, and rotating the lid 98 around a hinge 106.

Figure 18:
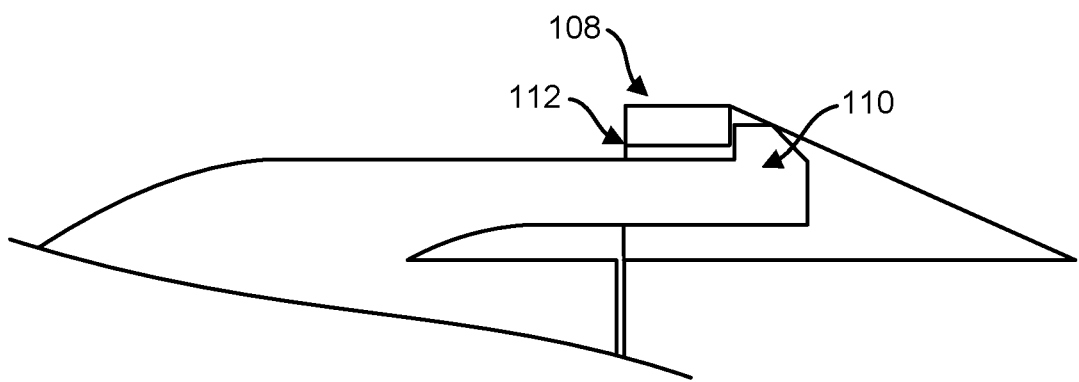
FIG. 18 illustrates a partial, cross-sectional view of a latching mechanism of the electronic housing module of FIG. 13.
Figure 19:
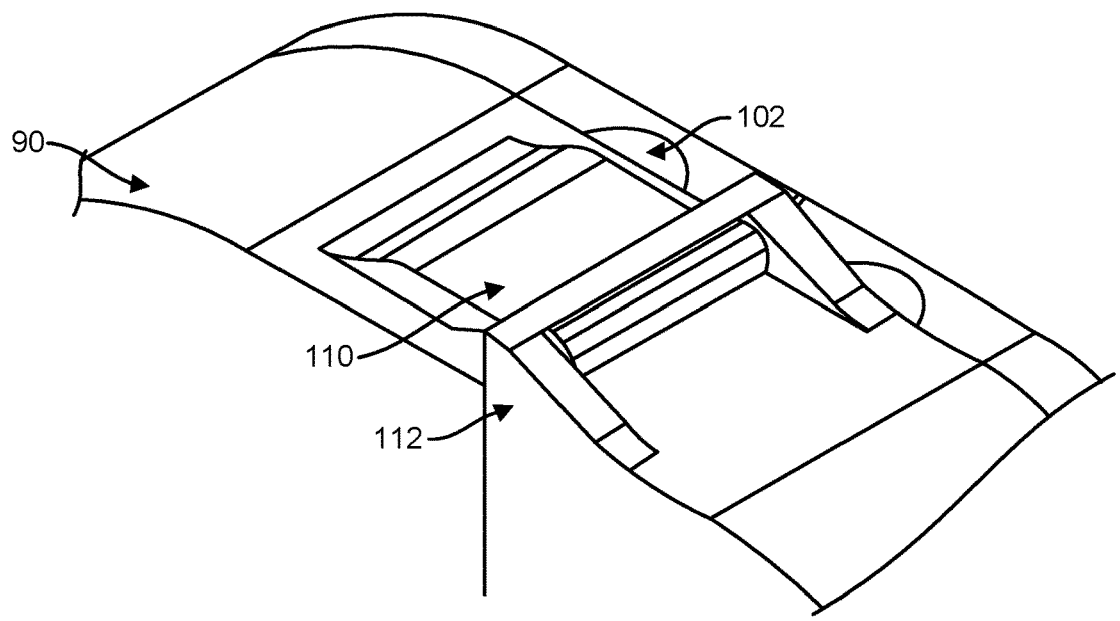
FIG. 19 illustrates a perspective view of the latching mechanism of the embodiment of FIG. 18.

As with the smart module 10, the electronics housing module 90 includes two halves, which can be identical. The two halves can be latched together around a wire bundle, and then connected to the smart module 10, as described above. FIG. 18 and FIG. 19 illustrate a latching mechanism 108 to latch the two halves of the electronics housing module 90. The latching mechanism 108 includes a tab 110 tab configured to engage a tab socket 112.

Figure 20:
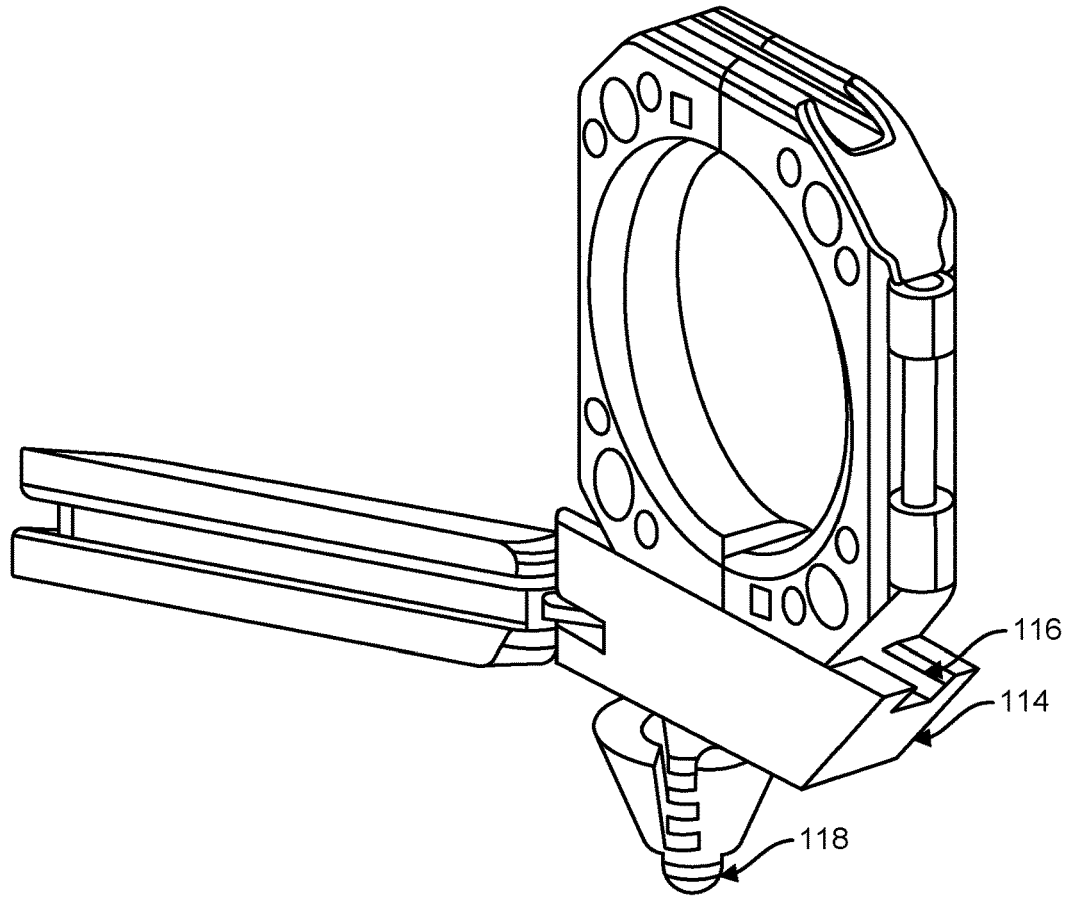
FIG. 20 illustrates a perspective view of a mounting element to mount a smart clamp to a surface, according to an embodiment, the mounting element attached to the smart clamp.
Figure 21:
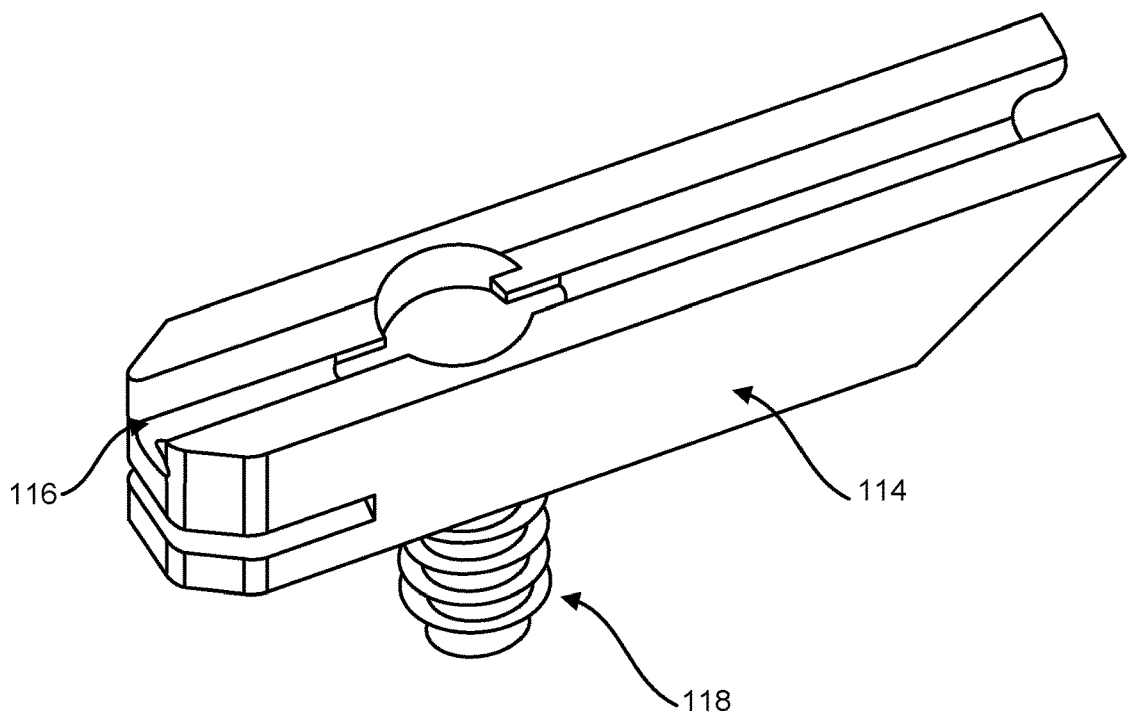
FIG. 21 illustrates a perspective view of a mounting element, according to an embodiment.

The smart clamps, which can be connected to each other and to the electronic housing modules 90, can also be mounted to machines or other items external to the clamping system. FIG. 20 illustrates a mounting element 114, which has a groove 116 and a pin 118. The pin 118 can be ribbed, tapered, threaded, for example. The pin 118 can attach to an appropriately sized hole in a machine or other item, and the groove 116 can attach to the ridge 70. FIG. 21 illustrates the mounting element 114 attached to a smart clamp 31.

Figure 22:
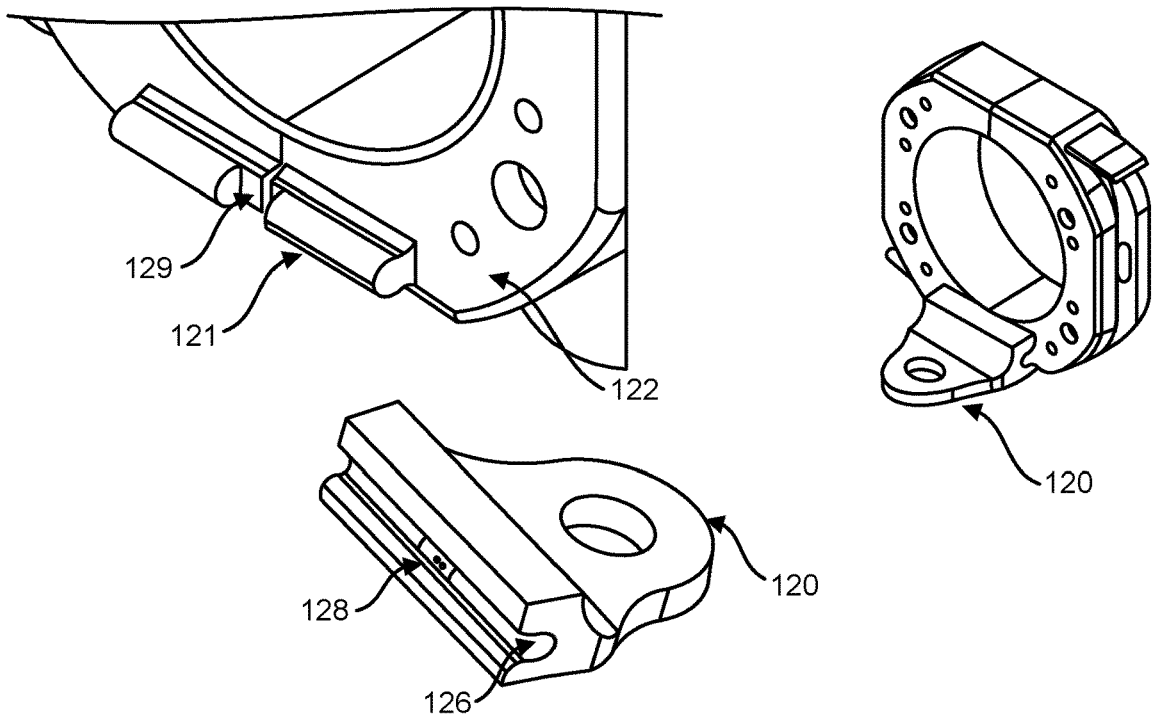
FIG. 22 illustrates a perspective view of a mounting bracket and a mounting on a smart clamp, according to an embodiment.

FIG. 22 illustrates another embodiment of a mounting element, which includes a bracket 120. A ridge 121 similar to the ridge 70 of smart clamp 31 can be positioned on a front face 122 of the smart clamp 31, and the bracket 120 with a groove 126 configured to slide onto the ridge 121, can attach to the ridge 121. The bracket 120 can be fastened to a machine or other item external to the smart clamp system, such as by, but not limited to, riveting, bolting, screwing, or welding. A safety tab 128 can be positioned in the groove 126 to prevent sliding between the groove 126 and the ridge 121 during vibration of the machine or other item to which the clamping system is mounted. The safety tab 128 engages a spacing 129 in the ridge 121 where each half of the ridge 121 and the body portions join.

Figure 23:
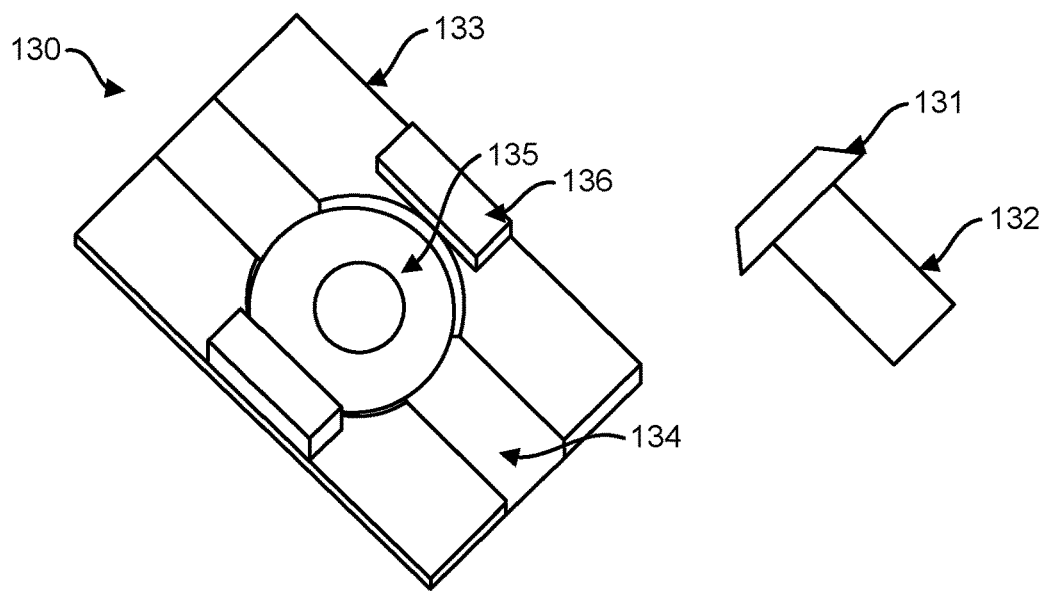
FIG. 23 illustrates a perspective view of a mounting bracket to mount a smart clamp to a surface, according to an embodiment.

FIG. 23 is a perspective view of a bracket 130 that attaches to an airframe or chassis of a vehicle using a standard military rivet 132. The bracket 130 has a general base portion 133 and a groove 134 extending in opposite directions from a rivet hole 135. It should be noted that the base portion 133 can be any of a variety of shapes that are generally known in the art (e.g., rectangular, square, round-shaped, I-shaped, H-shaped, horseshoe shaped, etc.). The bracket 130 may or may not have casters 136. A plurality of casters 136 may be part of the bracket 130 and may be adapted to support the smart clamp. The bracket 130 can be riveted to the airframe or chassis, through the rivet hole 135, and the groove 134, with a dovetail-shaped cross-section, can slide onto a ridge 137, which has a corresponding dovetail-shaped cross-section. In this embodiment, a head 131 of the rivet 132 can act like the safety tab 128 of the mounting bracket embodiment of FIG. 22, and the head 131 of the rivet 132 can engage the spacing 129 of the ridge 137 to prevent sliding of the bracket 130 with respect to the ridge 137.

Figure 24:
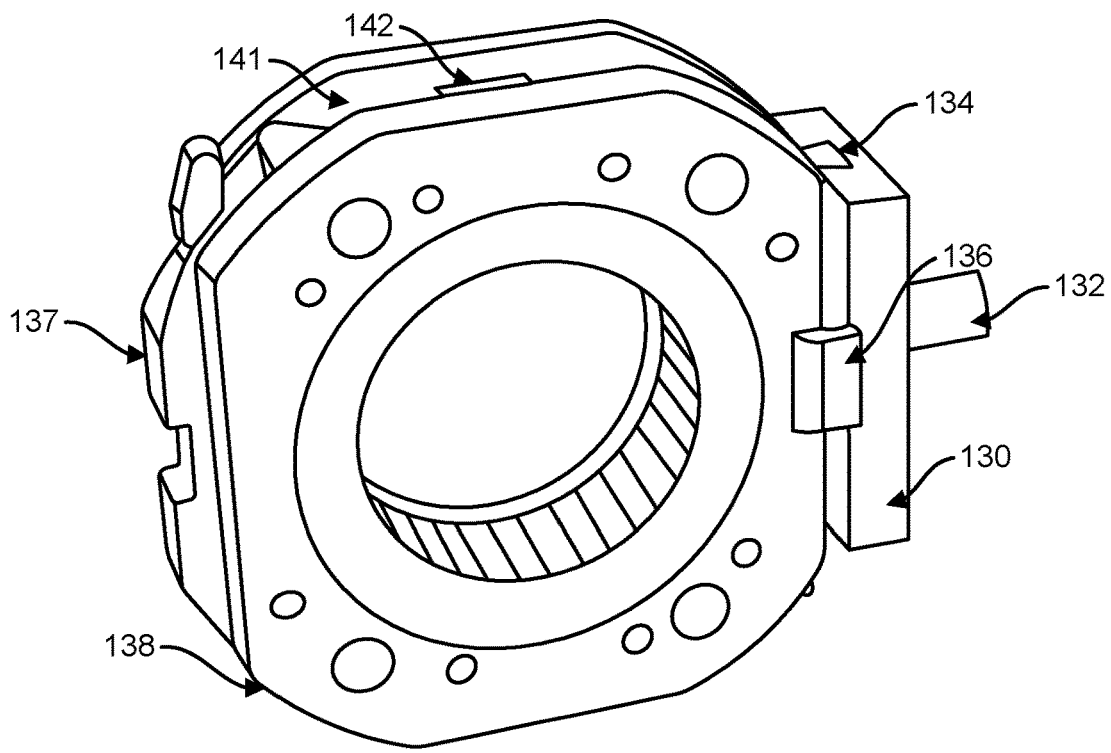
FIG. 24 illustrates a perspective view of the mounting bracket of FIG. 23 attached to a smart clamp, according to an embodiment.

FIG. 24 shows the bracket 130 and rivet 132 attached to a smart clamp 138. The casters 136 can press against a first face 139 and an opposite second face 140 of the smart clamp 138, while the ridge 137 engages the groove 134 and the head 131 of the rivet 132 engages the spacing 129 of the ridge 137. Another side of the smart clamp 138 includes a groove 141 identical to the groove 134 of the bracket 130, with a safety tab 142 like the safety tab 128 of the groove 134, such that a second smart clamp (not shown) identical to the smart clamp 138 can connect with the smart clamp 138 and be locked from sliding.

Mounted to a vehicle or other item, and in use to clamp wires, the smart clamps can be utilized as part of a smart clamping system to collect and report data for detection and diagnosis of wiring damage or faults. Each alternative embodiment of the smart clamping system provides a system for monitoring and visualizing the health of aircraft wiring integrity through the use of integrated wiring harness sensors and algorithms. The technology leverages potentially high volumes of data obtained by the smart clamp sensors to create better computing models through the use of augmented reality for predictions of wiring maintenance, fault identification, and repair.

Figure 25:
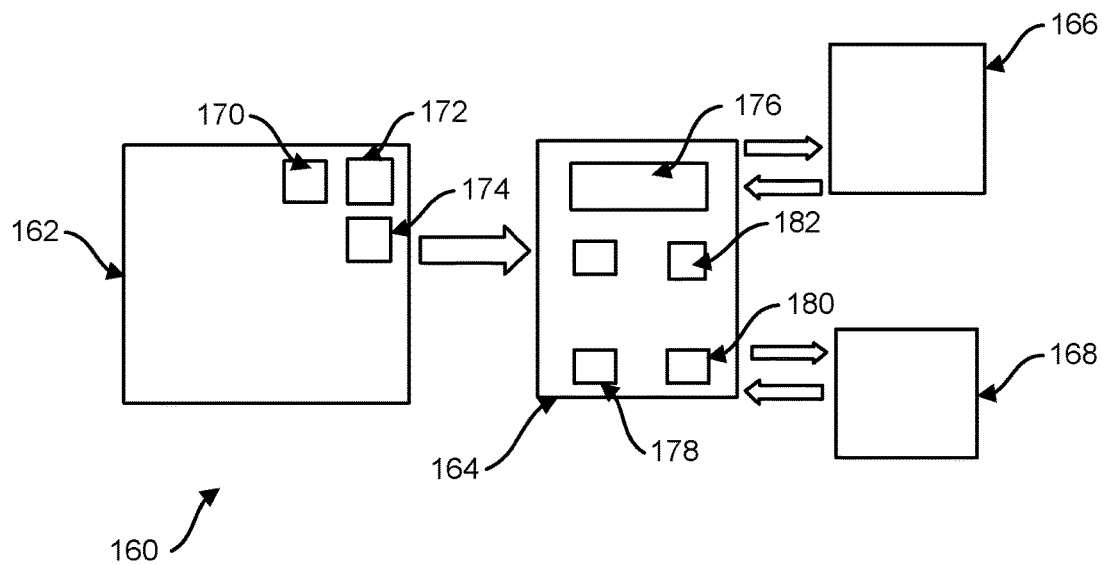
FIG. 25 schematically illustrates a smart clamping system, according to an embodiment.

FIG. 25 schematically illustrates a smart clamping system 160, which includes a smart clamp 162, a data acquisition device 164, a server 166, and a storage device 168. The smart clamping system 160 can include wireless communication, time-stamping, and collection and storage of smart interconnecting clamp data. Examples of the types of data collected include, but are not limited to, pressure data, temperature data, amperage data, and diagnostic and trouble code data.

The smart clamp 162, or a module connected to the smart clamp 162, can include a sensor 170, which generates data. The sensor 70 can be any now-known or future-developed type of sensor, and can retrieve smart clamp position data, temperature data, current data, frequency data, pressure data, and image data, amongst other data.

A processor 172 can control operation of the sensor 170 and a communications device 174, which can transmit the data to the acquisition device 164.

The data acquisition device 164 can include a stationary device, such as a mainframe computer system, or a handheld or wearable computing device, such as a tablet, hololens, or smart phone. The data acquisition device 164 can include an interrogator 176 that is able to read the information disposed within the vehicle. The data acquisition device 164 can further include a processor 178 for analyzing data generated by the sensor 172 in or connected to the smart clamp 162 and a communications device 180 (e.g., a transmitter, receiver, etc.) for transmitting the data to or from the smart clamp 162, or to and from another computer or device. The processor 178 can be configured to control the sensor 170 and communications device 174 of the smart clamp 162, rendering no need for the processor 172 of the smart clamp 162. The communications devices 174, 180 can be configured to communicate by Bluetooth, radio frequency, or any other now-known or future-developed wireless or wired communications mode.

The ability of the smart clamping system 160 to collect data with an RFID tag, Bluetooth, or any wireless communication device, and transmit the data to the external data acquisition device allows for the automation of fleet management processes, vehicle maintenance and repair processes, and certain security features. For example, the vehicle smart interconnecting clamp data can be automatically collected and stored for analysis by existing work-study software programs, which perform work time studies on the vehicles and their operators, including amperage leaks due to chafing and vibrations. Furthermore, the data can be compared with data ranges indicating normal operating conditions to determine if the vehicle is in need of immediate repair or maintenance. In addition, the external data acquisition device can be used to automatically perform certain security functions, such as detecting specific conditions and alerting a local computer or device if the security is breached.

As used herein, a computer, or other data acquisition device 164 can include a means for a user to interface with the smart clamping system 1, to display, review, and manipulate sensor data, or other vehicle data, and to enter information. The user interface can include a keyboard, touch screen, scanner, and a display, etc. The data acquisition device 164 may contain a memory 182, although in some embodiments the processor 178 and/or the memory 182 may reside elsewhere. The smart clamping system can assist a user to troubleshoot or check electrical wiring harnesses, providing an effective way to localize wiring faults and isolate a single wire. Images of templates of the electrical wiring harness being checked or a single wire causing the malfunction can be projected using the user interface of the data acquisition device 164. These images can be superimposed with additional images of aid requested by the technician, acting on virtual menus and/or buttons/icons projected on the smart handheld device. An image of a wiring harness component (for example, a connector or a wire where a fault can be isolated) captured on the data acquisition device 164 can be added to facilitate the execution of an operation in the component (for example, the identification of the connector to which a particular wire identified by its signal must be checked or a graph illustrating the diagram of said electrical system to which the connector or wire belongs to). The user interface of the data acquisition device 164 can include virtual menus, such as for selecting an additional image of aid by the technician in order to check electrical wiring harnesses.

Figure 26:
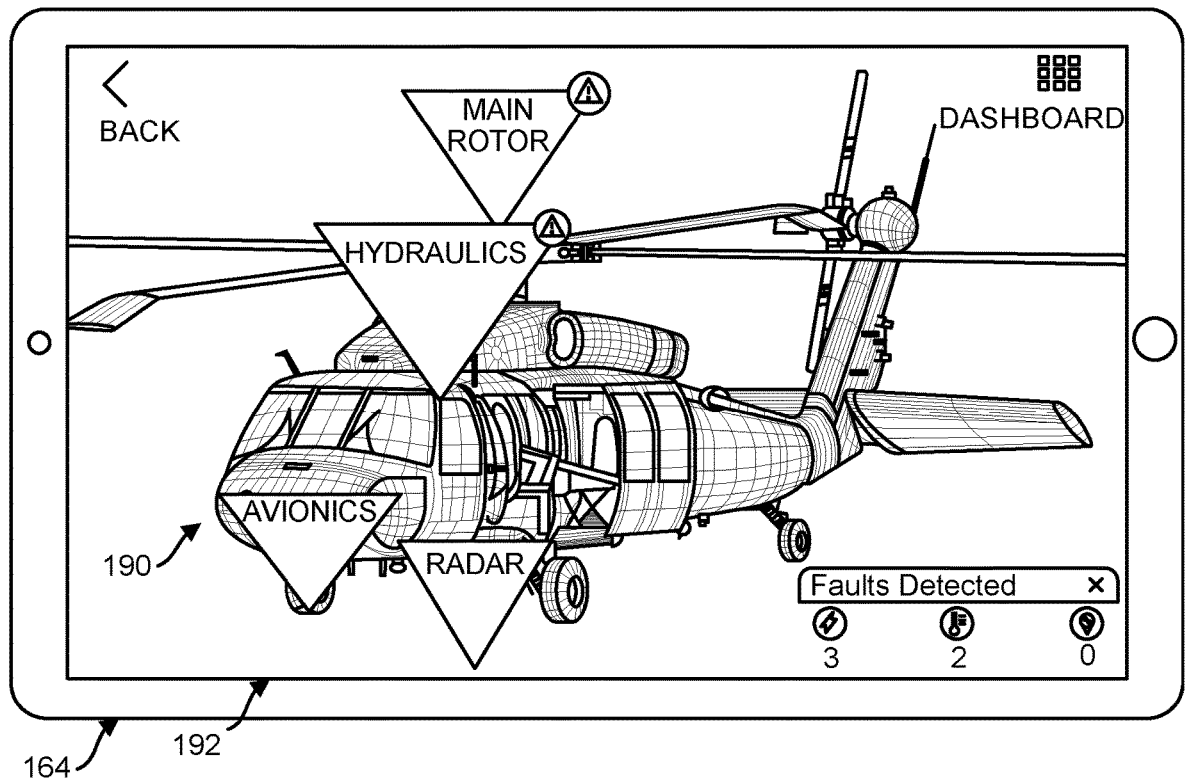
FIG. 26 illustrates an example of a vehicle on a display of a data acquisition device showing faults detected and reported, according to an embodiment.

FIG. 26 illustrates an example of a vehicle 190 on a display 192 of a data acquisition device 164 showing faults detected and reported by the smart clamping system 160.

Referring again to FIG. 25, the server 166 and the storage device 168 can connect to the data acquisition device 164 to scan the smart clamp 162 and make information requests. In addition, client server 166 may be, for example, a personal computer, a hand-held computer, a portable computer, a wearable device, or a network computer. Server 166 and storage device 168 can provide information, such as boot files, operating system images, data analytics, and applications to the data acquisition device 164. Server 166 and storage device 168 can be clients that may include additional server computers, client computers, and other devices.

Augmented reality monitoring is an artificial intelligence/augmented reality-enabled aspect of the smart clamping system 1 configured to save time during wiring predictive maintenance. As aircraft continue to age, the importance of wiring integrity becomes a safety concern. Deterioration of physical properties of wiring systems could result in failures increasing the sensitivity to electromagnetic fields. The augmented reality monitoring system provides a reliable method for detecting wiring defects before these defects become faults.

The augmented reality monitoring system can generate a multi-dimensional representation of the physical data. Wire bundles on aircraft are subject to external source disturbances during flight. Machine learning algorithms can be used to process large data sets from an array of interconnected smart clamps with built-in sensors regarding Electromagnetic Interference (EMI), also known as Radio-frequency Interference (RFI), that affects radios, mobile devices, and computer monitors, 'parallel' arc faults, when the leakage current travels in arcs through the insulation, and 'series' arc faults, measurements of impedance, damaged and aged insulation (poor contact between electrical conductors), damp, temperature, humidity, solar exposure, bandwidth, contamination, degradation over time, metal shavings from repairs, exposure to fluids, Ph levels and physical properties of insulation such as washing solutions or hydraulic fluids, flexibility, hardness, tensile strength, compressive strength, and torsion strength, etc.

Physical data captured at a point in time using a number of smart clamps can be used to create a multi-dimensional representation. This augmeted reality monitoring system can extract meaningful data or patterns from the data with proven algorithms to provide an integrated technology in the areas of evaluation, inspection, testing, training, wire repair technology and future wiring development, to provide a solution that will aid manufacturers and maintenance industries to make quick and accurate decisions on the fly to detect aging effects on wiring through the interconnection system provided by the smart clamps and process different types of data from failures and wiring faults, to provide data regarding failure characterization, diagnostics, interconnection technologies, and maintenance tools.

The smart clamping/augmented reality system can provide simplified maintenance to technicians for troubleshooting or checking electrical wiring harnesses in an interactive way. The augmented reality system can utilize machine learning, genetic algorithms, neural networks, or other artificial intelligence methods to study and learn from diagnostic results. The smart clamping system's adaptive AI capability across wiring systems could become an integral part of a vehicle to continuously monitor and locate wiring faults and wiring defects. The smart clamping system can monitor the wiring signals and store corresponding data into a database. Data from real-time inspection of wiring integrity can determine schedule maintenance and statistical analysis of electrical wiring. When fed with advanced machine learning algorithms or deep learning algorithms, the augmented reality of the smart clamping system becomes capable of detecting and erasing human prejudices from data-driven decisions.

In an embodiment of the smart clamping system, an augmented reality vision system for a wire harness troubleshooting environment can be implemented. The augmented reality vision system comprises a display system and a processor running a mobile application. The display system has a viewing area configured to display an image. The display system is handheld, wearable, or head-mounted. The mobile application provides data regarding the smart clamps and/or the wire harness. The mobile application receives an input to scan the aircraft. The mobile application retrieves task information associated with the wire harness containing the fault. The mobile application may receive a second input requesting information related to the wire localization. The mobile application generates a map of a branch of the wire harness based on the SICC indicating a location of a selected wire in the map.

A further embodiment of the smart clamping system is directed to a system for automating the collection of vehicle sensor data for fleet operations. The system includes a wireless and a portable data acquisition device accessible to a vehicle operator. The RFID or Bluetooth device includes an input interface for collecting data from one or more sensors that are disposed within a wire harness, a processor for associating a time-stamp with at least a portion of the data, and a memory for storing the time-stamped data. The portable data acquisition device includes a wireless interrogator for receiving the data from the memory of the device, a memory for storing the data, and a data acquisition processor. The memory of the portable data acquisition device stores one or more pre-selected delivery positions. In one embodiment, the portable data acquisition device alerts the operator of a fault within the wiring harness through an RFID tag. In another embodiment, the portable data acquisition device provides an alert to the operator of a fault within the wiring harness through Bluetooth communication. In a future embodiment, the portable data acquisition device provides an alert to the operator of a fault within the wiring harness through another alternative for wireless communication.

Figure 27:
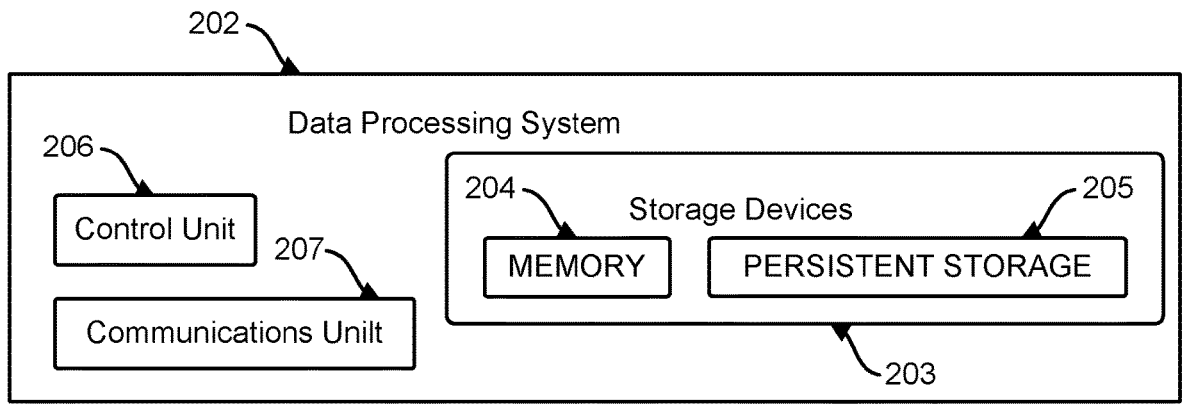
FIG. 27 illustrates a representation of a network of data processing system, according to an embodiment.

FIG. 27 depicts a representation of a network of data processing system 202 in which an embodiment may be implemented. Data processing system 202 is a network of communication and storage devices in which a portion of a smart clamping system may be implemented. The data processing system 202 contains storage devices 203, which are the medium used to store the data obtained by the smart clamping system 160 through memory 204 and persistent storage 205. The data processing system 202 provides communications links between various devices and computers connected together through a control unit 206 and a communications unit 207.

Figure 28:
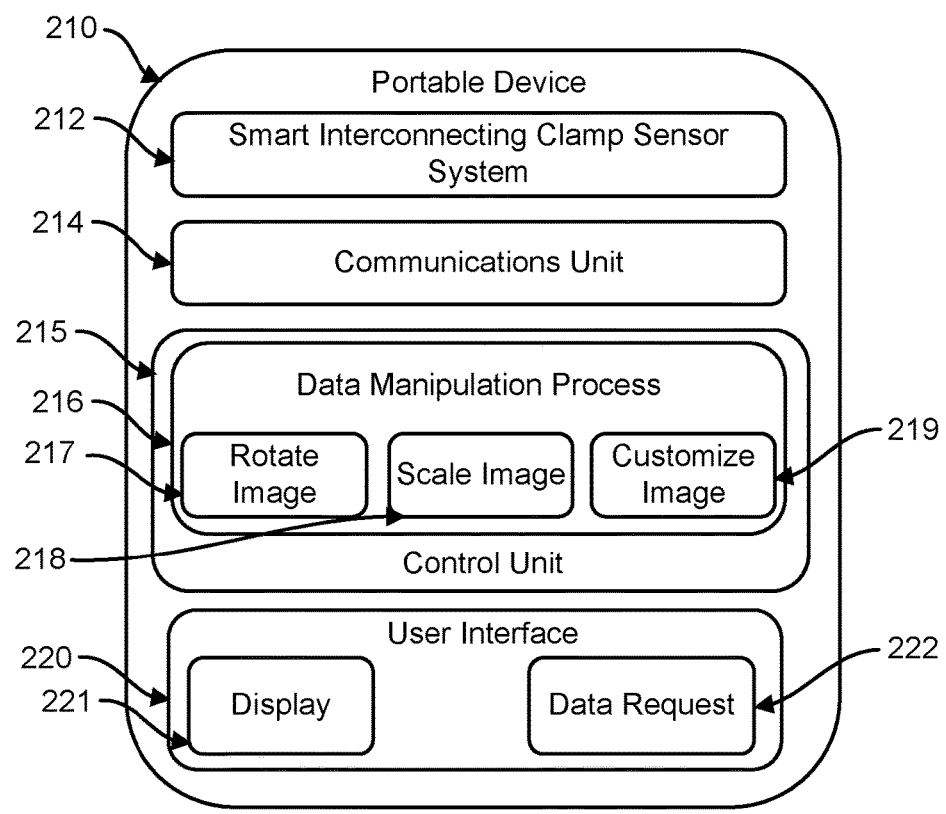
FIG. 28 schematically illustrates a portable/wearable device in a smart clamp sensor system, according to an embodiment.

FIG. 28 shows a portable/wearable device 210 that is used to visualize a smart clamp sensor system 212 and exchanges information through a communications unit 214. A control unit 215 is used for the data manipulation process through image rotation 217, scaling 218, and customization 219. A user interface 220 allows for display 221 and data request 222.

Figure 29:
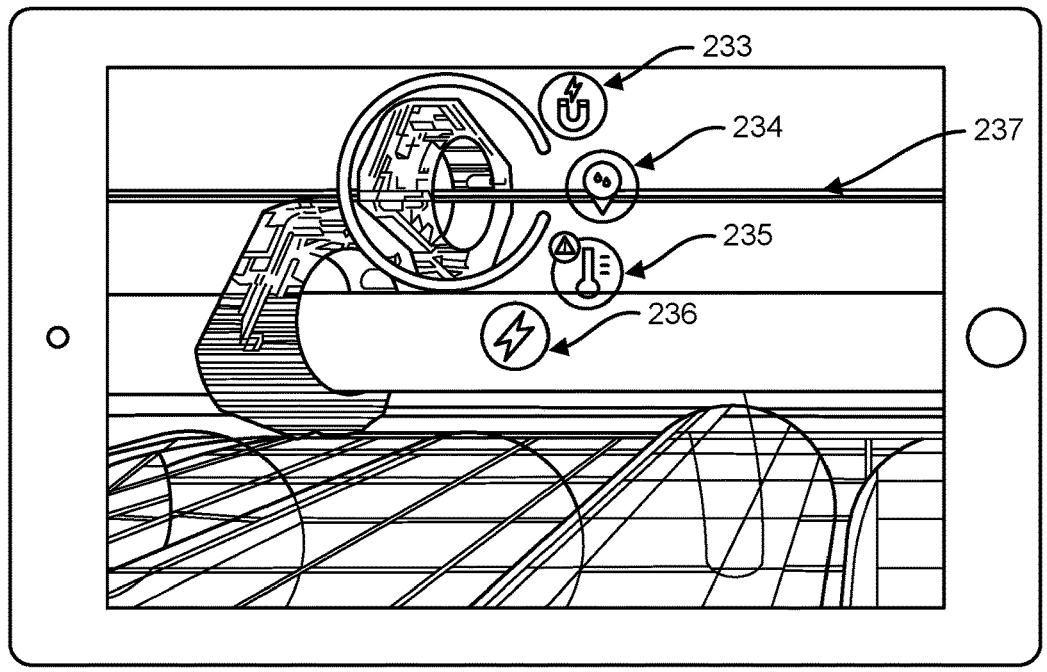
FIG. 29 schematically illustrates elements of a telematics data collection and evaluation system, according to an embodiment.

FIG. 29 shows various elements of a telematics data collection and evaluation system in accordance with one embodiment of the present invention. As explained in greater detail below, the active RFID tag, Bluetooth device, or other wireless device collects smart clamping system data and transmits the data to an external data acquisition device via an interrogator in communication with the external data acquisition device. The different measured parameters are displayed by their representing icons in a portable/wearable device, such as electromagnetic interference 233, humidity 234, temperature 235, amperage leak 236, among others. The faulty wire 237 is isolated within the alerted smart clamping system 1. The system receives information about physical data, such as the distance to a number of physical smart clamping system devices, and uses the physical data to generate spatial framework for physical smart clamping system devices. Spatial framework for physical and digital SICC devices may be, for example, without limitation, represented as a 3D vector/point. The 3D vector/point is a set of vertices in a three-dimensional coordinate system. These vertices are typically defined by X, Y and Z coordinates, and are intended to be representative of the external surface of a smart clamp system.

Figure 30:
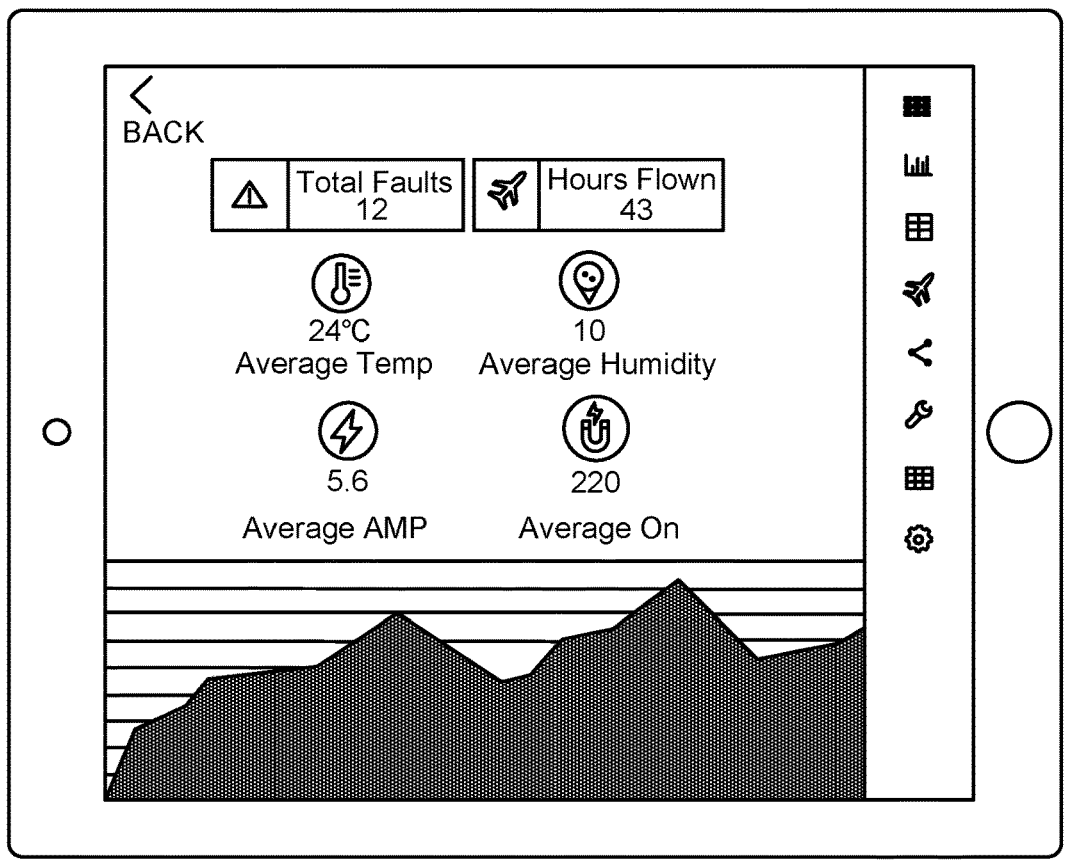
FIG. 30 illustrates a display of a portable device, according to an embodiment.

FIG. 30 is an illustration of a display of portable device depicted in accordance with an embodiment. The portable device in FIG. 30 is an illustrative example of one implementation of number of portable and wearable devices. FIG. 30 is also a depiction of the data displayed through a metrology process. An overlay of digital information, physical data, and other digital data, a mapping of digital information and other digital data to physical data. Other digital data may be, for example, without limitation, text, graphics, icons, and other data that may be overlaid with physical data to augment the reality.

Figure 31:
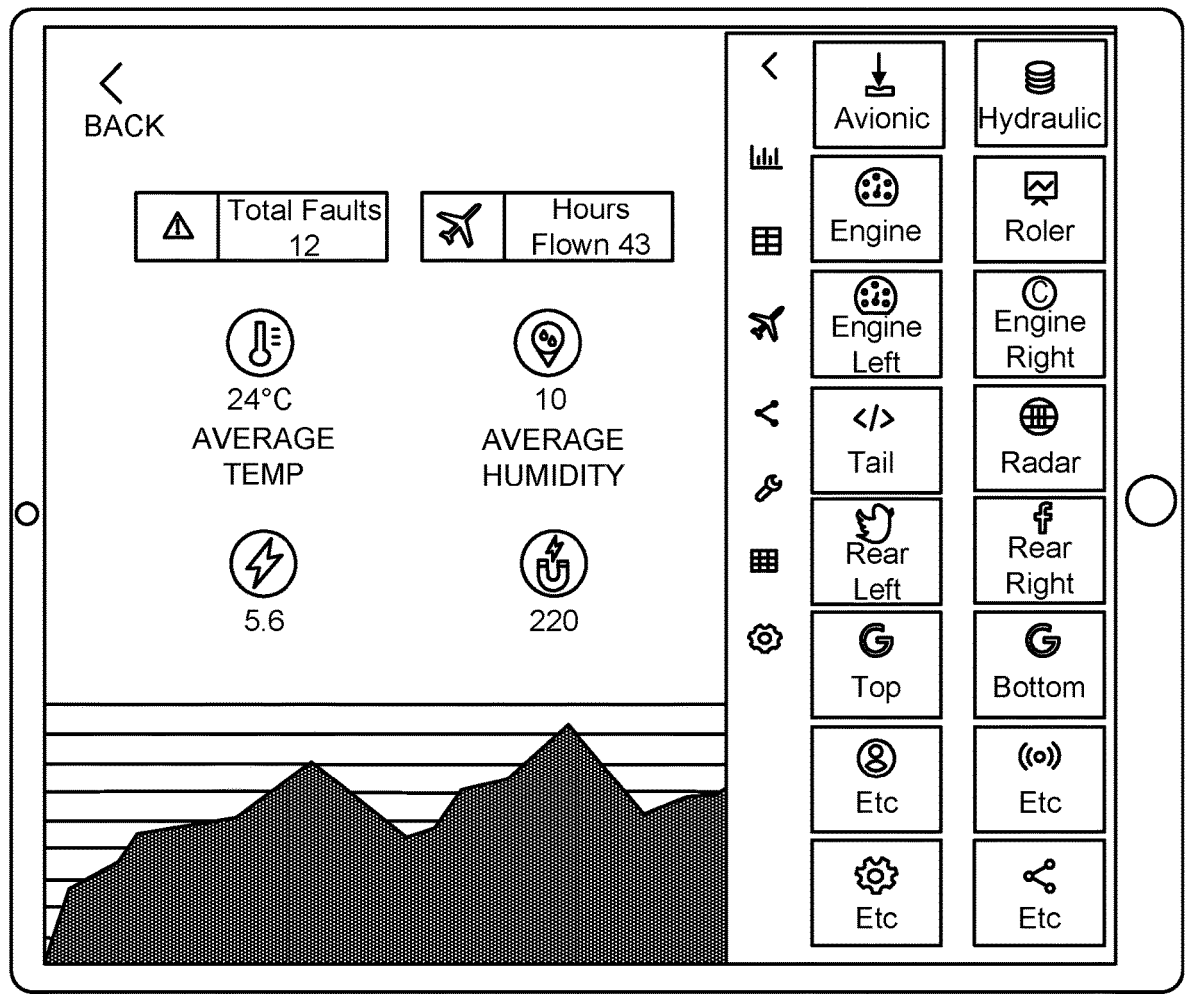
FIG. 31 illustrates a multi-data representation displayed on a portable device, according to an embodiment.

FIG. 31 is a multi-data representation that may be viewed by a user using display. Multi-data representation may be manipulated for different viewing options using data manipulation controls and icons to activate data manipulation process. In an illustrative example, a user may input image request to data manipulation controls. Image request may be a request for a desired view to be streamed to portable device.

It is to be understood that the embodiments of the invention herein described are merely illustrative of the application of the principles of the invention. Aspects of different embodiments described herein can be combined in other embodiments. Reference herein to details of the illustrated embodiments is not intended to limit the scope of the claims, which themselves recite those features regarded as essential to the invention.

What is claimed is:

1. An apparatus for monitoring the integrity of an electrical wire or a wiring harness, the apparatus comprising:
 a clamp system including at least one clamp to clamp the wire or the wiring harness;
 a sensor system including at least one sensor supported by the smart clamp, the at least one sensor configured to retrieve wire or wiring harness data;
 a user interface configured to receive input data and output wire or wiring harness information; and
 a control unit configured to process the wire or wiring harness data, receive from the user interface and process the input data, generate the wire or wiring harness information, and transmit the wire or wiring harness information to the user interface.

2. The apparatus of claim 1, wherein the output wiring or wiring harness information includes a multi-dimensional representation of a virtual reality or augmented reality of the wire or wiring harness.

3. The apparatus of claim 2, wherein the control unit and the user interface are configured to enable rotation and scaling of the multi-dimensional representation.

4. The apparatus of claim 1, wherein the output wiring or wiring harness information includes a fault detection characterization.

5. The apparatus of claim 1, wherein the control unit is configured with a machine
 learning algorithm to process wire or wiring harness data for monitoring the integrity of the wire or wiring harness.

6. The apparatus of claim 1, further comprising a communications device supported by the at least one clamp, the communications device configured to communicate the wire or wiring harness data to the control unit.

7. The apparatus of claim 1, further comprising a power supply supported by the at least one clamp, the power supply configured to supply electricity to the least one sensor.

8. The apparatus of claim 1, wherein the at least one sensor is configured to retrieve at least one of clamp location, current, current leakage, electromagnetic interference, frequency, temperature, and humidity.

9. The apparatus of claim 1, wherein the at least one sensor is configured to retrieve a physical image.

10. The apparatus of claim 1, wherein the user interface device includes at least one of a hand held computing device, a wearable computing device, and a portable computing device.

11. The apparatus of claim 1, wherein the control unit is configured to generate a number of digital definitions in a metrology process using the wire or wiring harness data, and generate in a multi-dimensional generation process a multi-dimensional representation of a combined augmented reality of the wire or wiring harness using the multi-dimensional representation including physical data for the wire or wiring harness including an image of a surface of the object and digital data for the wire or wiring harness including a first overlay representing components associated with the wire or wiring harness and a second overlay indicating a damaged area of the object, the control unit further configured to transmit the multi-dimensional representation to the user interface.

12. The apparatus of claim 1, wherein the at least one clamp at least partially defines a channel, the channel configured to pass the electrical wire or wiring harness entirely therethrough.

13. The apparatus of claim 1, wherein the clamp includes a first body portion and a second body portion configured to mate with the first body portion and configured to form a center hole to pass and hold the electrical wire or wire harness.

14. An apparatus for providing an augmented reality view of a vehicle, the apparatus comprising:
 a portable computing device configured to obtain wire or wire harness data from a smart clamping system, to transmit the wire or wire harness data to a processor, and to receive a multi-dimensional representation; and
 a computer system remote from the portable computing device configured to receive the wire or wire harness data generated by the portable computing device, generate a number of digital definitions in a metrology process using the wire harness data, generate a multi-dimensional representation of a combined augmented reality of the wire or wiring harness, and transmit the multi-dimensional representation to the portable computing device for display, wherein the portable computing device includes at least one user interface, and wherein the multi-dimensional representation is configured to be viewed by a user using the user interface.

15. The apparatus of claim 14, wherein the smart clamping system includes at least one sensor to obtain the wire or wire harness data and a positioning system.

16. The apparatus of claim 14, wherein the wire or wire harness data includes at least one of clamp location, current, current leakage, electromagnetic interference, frequency, temperature, and humidity.

17. The apparatus of claim 14, wherein the multi-dimensional representation includes a wire or wire harness integrity characterization.

18. A method for monitoring a wire or wire harness, the method comprising:
 capturing wire or wire harness data using a clamp, the clamp including a sensor; transmitting the wire or wire harness data captured by the clamp to a control unit; generating wire or wiring harness information to output; and
 outputting the wire or wiring harness information through a portable device.

19. The method of claim 18, wherein the output wire or wiring harness information
 includes a multi-dimensional representation of a virtual reality or augmented reality of the wire or wiring harness.

20. The method of claim 18, wherein the wire or wiring harness information includes a wire or wiring harness integrity characterization.

21. The method of claim 18, wherein the wire or wire harness data includes at least one of clamp location, current, current leakage, electromagnetic interference, frequency, temperature, and humidity.

22. The method of claim 18, further comprising predicting wire or wiring harness degradation based on wire or wiring harness data and advanced analytics to establish preventative maintenance before wire or wiring harness failure.

23. The method of claim 18, further comprising positioning the clamp such that the wire or wire harness extends entirely through a wire channel of the clamp.

24. An apparatus for monitoring the integrity of an electrical wire or a wiring harness, the apparatus comprising:
 a clamp system including at least one clamp to clamp the wire or the wiring harness;
 a sensor system including at least one sensor supported by the smart clamp, the at least one sensor configured to retrieve wire or wiring harness data;
 a user interface configured to receive input data and output wire or wiring harness information; and
 a control unit configured to process the wire or wiring harness data, process the input data, and generate the output wire or wiring harness information, the control unit configured to generate a number of digital definitions in a metrology process using the wire or wiring harness data, and generate in a multi-dimensional generation process a multi-dimensional representation of a combined augmented reality of the wire or wiring harness using the multi-dimensional representation including physical data for the wire or wiring harness including an image of a surface of the object and digital data for the wire or wiring harness including a first overlay representing components associated with the wire or wiring harness and a second overlay indicating a damaged area of the object, the control unit further configured to transmit the multi-dimensional representation to the user interface.

* * * * *